(12) United States Patent
Kim et al.

(10) Patent No.: US 12,273,474 B2
(45) Date of Patent: *Apr. 8, 2025

(54) ELECTRONIC DEVICE INCLUDING WATERPROOF STRUCTURE

(71) Applicant: Samsung Electronics Co., Ltd., Suwon-si (KR)

(72) Inventors: Gidae Kim, Suwon-si (KR); Moohyun Baek, Suwon-si (KR); Minsung Lee, Suwon-si (KR); Jongchul Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/582,059

(22) Filed: Feb. 20, 2024

(65) Prior Publication Data

US 2024/0195895 A1 Jun. 13, 2024

Related U.S. Application Data

(63) Continuation of application No. 17/983,917, filed on Nov. 9, 2022, now Pat. No. 11,930,127, which is a (Continued)

(30) Foreign Application Priority Data

Nov. 16, 2018 (KR) ........................ 10-2018-0141330

(51) Int. Cl.
  *H04M 1/02* (2006.01)
  *H05K 1/03* (2006.01)
  *H05K 3/36* (2006.01)

(52) U.S. Cl.
  CPC ........ *H04M 1/0216* (2013.01); *H05K 1/0393* (2013.01); *H05K 3/361* (2013.01); *H04M 1/0268* (2013.01)

(58) Field of Classification Search
  CPC .... G06F 1/1616; G06F 1/1652; G06F 1/1656; G06F 1/1683; G06F 1/1681;
  (Continued)

(56) References Cited

U.S. PATENT DOCUMENTS 7,251,512 B2 7/2007 Komiyama
7,466,558 B2 12/2008 Yasuda
(Continued)

FOREIGN PATENT DOCUMENTS

CN 201878463 U 6/2011
JP 2007-235984 A 9/2007
(Continued)

OTHER PUBLICATIONS

European Search report dated Oct. 18, 2021, issued in European Application No. 19884668.5.
(Continued)

*Primary Examiner* — Andrew Wendell
(74) *Attorney, Agent, or Firm* — Jefferson IP Law, LLP

(57) ABSTRACT

An electronic device is provided. The electronic device includes a hinge structure, a first housing structure, a second housing structure that is foldable with the first housing structure, a foldable housing, a flexible display, a first mid-plate disposed on one side of the first housing structure, a second mid-plate disposed on one side of the second housing structure, a flexible printed circuit board (FPCB) extending between the first mid-plate and the second mid-plate, a first sealing member that seals a first opening formed in the first mid-plate, and a second sealing member that seals a second opening formed in the second mid-plate.

20 Claims, 16 Drawing Sheets

Related U.S. Application Data continuation of application No. 16/675,663, filed on Nov. 6, 2019, now Pat. No. 11,528,349.

(58) Field of Classification Search
CPC .... H04M 1/0216; H04M 1/0268; H04M 1/18; H05K 1/028; H05K 1/0393; H05K 1/148; H05K 2201/10189; H05K 3/361; H05K 2201/05; H04B 1/03; H04B 1/08
USPC ...................................................... 455/575.3
See application file for complete search history.

(56) References Cited

U.S. PATENT DOCUMENTS

| | | | |
|---|---|---|---|
| 8,625,290 B2 | 1/2014 | Wee et al. | |
| 8,939,284 B2 | 1/2015 | Kumagai | |
| 9,690,128 B2 | 6/2017 | Kang et al. | |
| 9,720,450 B2 | 8/2017 | Choi et al. | |
| 9,912,138 B2 | 3/2018 | Wee et al. | |
| 10,074,673 B2 | 9/2018 | Choi | |
| 10,433,438 B2 * | 10/2019 | Moon | G06F 1/1652 |
| 10,827,633 B2 | 11/2020 | Yoo et al. | |
| 10,856,430 B2 | 12/2020 | Yoo et al. | |
| 11,032,929 B2 | 6/2021 | Yoo et al. | |
| 11,528,349 B2 | 12/2022 | Kim et al. | |
| 11,576,272 B2 | 2/2023 | Yoo et al. | |
| 11,930,127 B2 * | 3/2024 | Kim | H05K 1/0393 |
| 2002/0135993 A1 * | 9/2002 | Ueyama | H04M 1/0216 361/752 |
| 2003/0211873 A1 | 11/2003 | Komiyama | |
| 2004/0162120 A1 | 8/2004 | Kurono | |
| 2006/0279942 A1 | 12/2006 | Yasuda | |
| 2010/0041448 A1 | 2/2010 | Gaddy et al. | |
| 2011/0090652 A1 | 4/2011 | Wee et al. | |
| 2011/0280430 A1 | 11/2011 | Kim et al. | |
| 2013/0020747 A1 | 1/2013 | Kumagai | |
| 2013/0050961 A1 | 2/2013 | Kang | |
| 2013/0120703 A1 | 5/2013 | Noda et al. | |
| 2014/0083761 A1 | 3/2014 | Wee et al. | |
| 2016/0026030 A1 | 1/2016 | Kang et al. | |
| 2016/0147263 A1 | 5/2016 | Choi et al. | |
| 2017/0148826 A1 | 5/2017 | Choi | |
| 2018/0324964 A1 | 11/2018 | Yoo et al. | |
| 2019/0174658 A1 | 6/2019 | Qi et al. | |
| 2020/0053897 A1 | 2/2020 | Woo et al. | |
| 2020/0119429 A1 | 4/2020 | Park et al. | |
| 2020/0136668 A1 | 4/2020 | Chu et al. | |
| 2020/0174516 A1 * | 6/2020 | Wheeler | A44C 5/003 |
| 2021/0344783 A1 | 11/2021 | Jeong et al. | |
| 2021/0377372 A1 | 12/2021 | Jung et al. | |
| 2022/0061175 A1 | 2/2022 | Oh et al. | |

FOREIGN PATENT DOCUMENTS

| | | | |
|---|---|---|---|
| KR | 10-2011-0041390 A | 4/2011 | |
| KR | 10-2012-0115018 A | 10/2012 | |
| KR | 10-2013-0120703 A | 11/2013 | |
| KR | 10-2015-0082041 A | 7/2015 | |
| KR | 10-2016-0024151 A | 3/2016 | |
| KR | 10-2016-0061064 A | 5/2016 | |
| KR | 10-2017-0060215 A | 6/2017 | |

OTHER PUBLICATIONS

International Search Report and Written Opinion dated Mar. 17, 2020, Issued in International Application No. PCT/KR2019/015408.
Korean Office Action dated Oct. 28, 2022, issued in Korean Patent Application No. 10-2018-0141330.
European Office Action dated Dec. 23, 2022, issued in European Application No. 19884668.5.
Korean Notice of Allowance dated Jan. 18, 2023, issued in Korean Patent Application No. 10-2018-0141330.
Chinese Office Action dated Nov. 6, 2023, issued in Chinese Application No. 201980075492.1.
European Search Report dated Jul. 1, 2024, issued in European Application No. 24164671.0.
Chinese Office Action dated Jul. 26, 2024, issued in Chinese Application No. 201980075492.1.
Korean Notice of Allowance dated Aug. 26, 2024, issued in Korean Application No. 10-2023-0050421.

* cited by examiner

<801>

<803>

ELECTRONIC DEVICE INCLUDING WATERPROOF STRUCTURE

CROSS-REFERENCE TO RELATED APPLICATION(S)

This application is a continuation application of prior application Ser. No. 17/983,917, filed on Nov. 9, 2022, which is a continuation application of prior application Ser. No. 16/675,663, filed on Nov. 6, 2019, which has issued as U.S. Pat. No. 11,528,349 on Dec. 13, 2022 and is based on claims priority under 35 U.S.C. § 119(a) of a Korean patent application number 10-2018-0141330, filed on Nov. 16, 2018, in the Korean Intellectual Property Office, the disclosure of which is incorporated by reference herein its entirety.

BACKGROUND

1. Field

The disclosure relates to a structure of an electronic device for preventing an inflow of fluid.

2. Description of Related Art

A mobile device may be exposed to various environments because it is easy to carry. For example, the mobile device may be easily exposed to a rainy environment or a moist or wet environment. If fluid infiltrates into the mobile device, the fluid may cause damage. Accordingly, various waterproof structures for mobile devices have been proposed.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an electronic device including a waterproof structure for protecting one or more parts disposed in the interior and on the exterior of the electronic device, by providing the waterproof structure of the electronic device that employs a hinge structure of a foldable electronic device.

In accordance with an aspect of the disclosure, an electronic device is provided. The electronic device includes a foldable housing including a hinge structure, a first housing structure that is connected to the hinge structure and that includes a first surface facing a first direction, a second surface facing a second direction opposite to the first direction, and a first side member that at least partially surrounds a space formed between the first surface and the second surface, and a second housing structure that is connected to the hinge structure and that includes a third surface facing a third direction, a fourth surface facing a fourth direction opposite to the third direction, and a second side member that at least partially surrounds a space formed between the third surface and the fourth surface, the second housing structure being folded together with the first housing structure around the hinge structure, wherein in a folded state, at least part of the first surface is opposite the third surface, and in an unfolded state, the third direction is the same as the first direction, a display extending from the first surface to the third surface to form at least part of the first surface and the third surface, a first mid-plate disposed between the display and the second surface, the first mid-plate extending from the first side member in a direction perpendicular to the first direction and including a first opening, a second mid-plate disposed between the display and the fourth surface, the second mid-plate extending from the second side member in a direction perpendicular to the third direction and including a second opening, a flexible printed circuit board (FPCB) extending across the hinge structure from a first space formed between the first mid-plate and the second surface to a second space formed between the second mid-plate and the fourth surface, a first sealing member that seals the first opening, and a second sealing member that seals the second opening.

In accordance with another aspect of the disclosure, an electronic device is provided. The electronic device includes a first housing including a first connecting hole through one surface of the first housing, a second housing, a hinge structure that connects the first housing and the second housing and supports a hinge motion of the first housing or the second housing, a first printed circuit board disposed in the first housing, a second printed circuit board disposed in the second housing, a first connecting printed circuit board (PCB) disposed to cover at least part of an opening on one side of the first connecting hole and electrically connected to the first printed circuit board, and a flexible PCB, at least part of which is disposed in the hinge structure, wherein one side of the flexible PCB is electrically connected with the first connecting PCB.

In accordance with another aspect of the disclosure, an electronic device is provided. The electronic device includes a first housing including a first connecting hole through one surface of the first housing, a second housing including a second connecting hole through one surface of the second housing, a hinge structure that connects the first housing and the second housing and supports a hinge motion of the first housing or the second housing, a first printed circuit board disposed in the first housing, a second printed circuit board disposed in the second housing, a flexible PCB that connects the first printed circuit board and the second printed circuit board, at least part of the flexible PCB being disposed on one side of the hinge structure, a first waterproof member that blocks a fluid flow into the first connecting hole, and a second waterproof member that blocks a fluid flow into the second connecting hole. The flexible PCB includes a first sub-FPCB, at least part of which is mounted in the first connecting hole, a second sub-FPCB, at least part of which is mounted in the second connecting hole, and a central FPCB that connects the first sub-FPCB and the second sub-FPCB.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
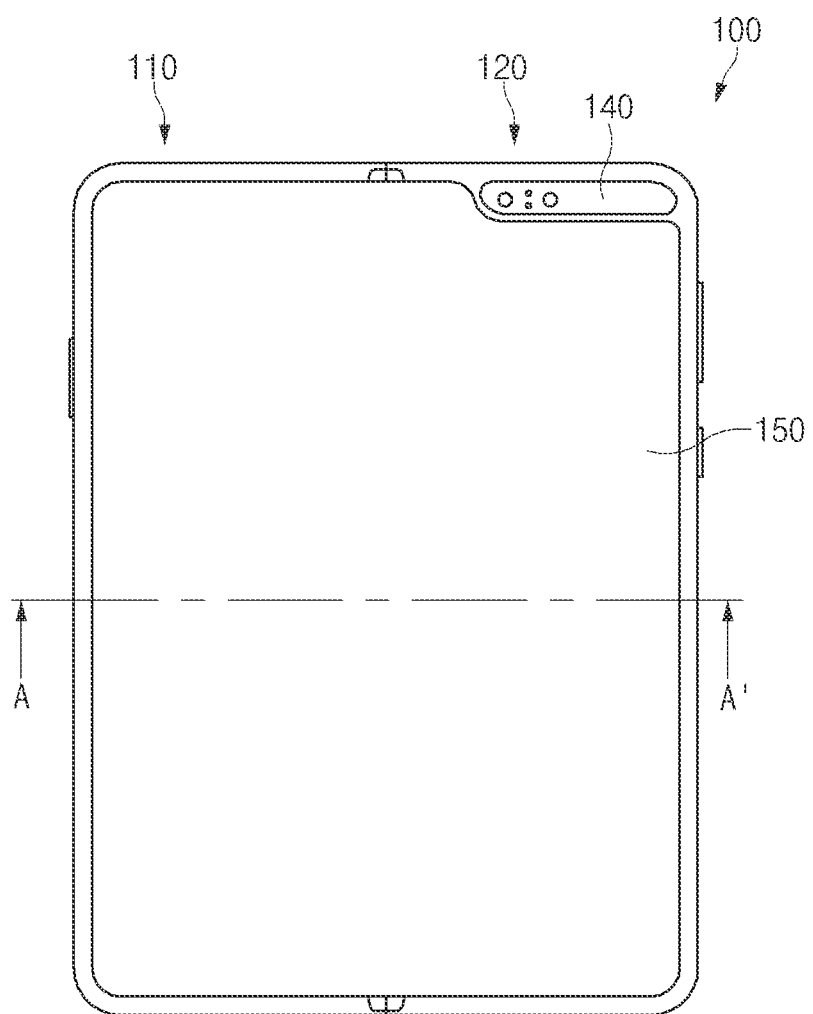
FIG. 1 is a view illustrating an example of the exterior of an electronic device according to an embodiment of the disclosure.

FIG. 1 is a view illustrating an example of the exterior of an electronic device according to an embodiment of the disclosure.

Figure 2:
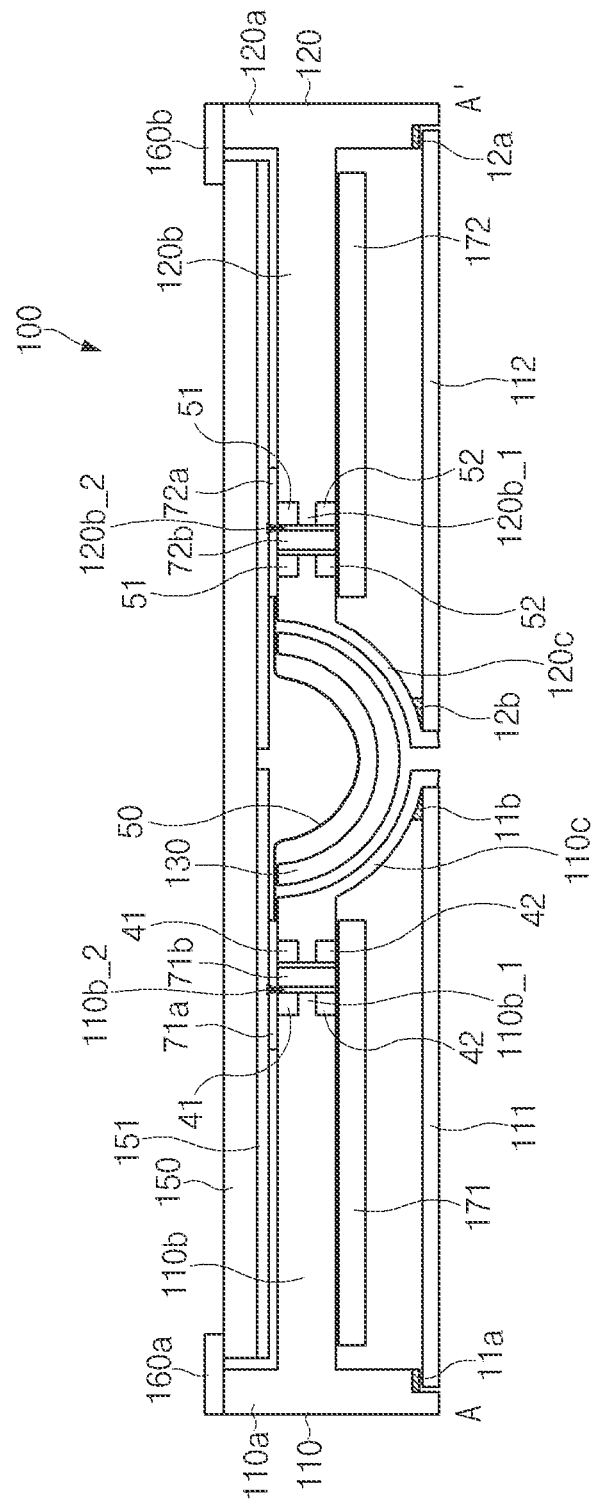
FIG. 2 is a sectional view of the electronic device according to an embodiment of the disclosure.

FIG. 2 is a sectional view of the electronic device according to an embodiment of the disclosure.

Here, FIG. 2 illustrates an example of a section taken along line A-A' of FIG. 1.

Referring to FIGS. 1 and 2, an electronic device 100 according to an embodiment may include a first housing 110 (or a first frame), a second housing 120 (or a second frame), a display 150, and a camera 140.

Additionally or alternatively, the electronic device 100 may further include at least one of a processor for driving the display 150, a printed circuit board (PCB) (e.g., a first printed circuit board 171 or a second printed circuit board 172) on which the processor is seated or otherwise coupled, a first flexible PCB 50 disposed between the first printed circuit board 171 and the second printed circuit board 172, connecting PCBs 71a and 72a that connect the first flexible PCB 50 and the printed circuit boards 171 and 172, a battery for supplying power to the processor, communication circuitry, or an antenna.

At least one of the processor, the printed circuit board, the battery, the communication circuitry, or the antenna may be disposed in the first housing 110 or the second housing 120. In addition, the electronic device 100 may further include a hinge structure 130 that connects at least part of the first housing 110 and at least part of the second housing 120 and performs a hinge motion to allow the first housing 110 and the second housing 120 to form a predetermined angle therebetween. The hinge structure 130 may be disposed in the middle between the first housing 110 and the second housing 120. The electronic device 100 may further include a first bezel 160a (or a first decoration) that is disposed on one side of the first housing 110 and a second bezel 160b (or a second decoration) that is disposed on one side of the second housing 120. The first bezel 160a may be disposed to cover, for example, at least part of an edge on one side of the display 150 seated on the first housing 110. The second bezel 160b may be disposed to cover, for example, at least part of an edge on an opposite side of the display 150 seated on the second housing 120.

A first rear panel 111 may be disposed on at least part of the rear side of the first housing 110, and a second rear panel 112 may be disposed on at least part of the rear side of the second housing 120. At least part of the first rear panel 111 and at least part of the second rear panel 112 may be formed of at least one of glass, a ceramic material, a reinforced plastic material, an acrylic resin, or a combination thereof.

The first rear panel 111 may be disposed to cover at least part of the rear side of the first housing 110. At this time, with regard to prevention of a fluid flow into the space inward of the rear side of the first housing 110, waterproof members may be disposed on the edge of the first rear panel 111 that meets the first housing 110. The waterproof members may include, for example, a first rear waterproof member 11a at least partially disposed between a first sidewall 110a and one side of the first rear panel 111 (e.g., the left edge of the first rear panel 111) and a first cover waterproof member 11*b* at least partially disposed between one side of a first hinge cover 110*c* and an opposite side of the first rear panel 111 (e.g., the right edge of the first rear panel 111).

The second rear panel 112 may be disposed to cover at least part of the rear side of the second housing 120. At this time, with regard to prevention of a fluid flow into the space inward of the rear side of the second housing 120, waterproof members may be disposed on the edge of the second rear panel 112 that meets the second housing 120. The waterproof members may include, for example, a second rear waterproof member 12*a* at least partially disposed between a second sidewall 120*a* and one side of the second rear panel 112 (e.g., the right edge of the second rear panel 112) and a second cover waterproof member 12*b* at least partially disposed between one side of a second hinge cover 120*c* and an opposite side of the second rear panel 112 (e.g., the left edge of the second rear panel 112).

At least part of the display 150 may be disposed across the first housing 110 and the second housing 120. The display 150 may have flexibility such that at least part of the central portion thereof is able to be bent at a specified angle or more. A rear side part 151 may be disposed on at least part of the rear surface of the display 150. The rear side part 151 may serve to fix the display 150 to the first housing 110 and the second housing 120. Accordingly, at least part of the rear side part 151 may include an adhesive layer. Alternatively, the rear side part 151 may further include at least one of a heat dissipation layer for dissipating heat generated from the display 150 and a stress absorption layer (e.g., an elastic layer, or embo layer) for reducing an impact applied from the outside. The rear side part 151 may be provided in a separated form without being formed on the central portion of the display 150.

At least part of the first housing 110 may be formed of at least one of a metal material, a ceramic material, an injection-molded material (or an injection-molded structure), or a combination thereof. The first housing 110 may include the first sidewall 110*a*, a first bottom part 110*b*, and the first hinge cover 110*c*.

The first sidewall 110*a* may be disposed to have a predetermined length and width in the vertical direction in the illustrated drawing. The first sidewall 110*a* may be disposed such that at least part of the first sidewall 110*a* surrounds at least part of the left edge of the display 150. The first bottom part 110*b* may be disposed at a predetermined position on the first sidewall 110*a* and may have a predetermined area and width in a direction (e.g., the horizontal direction) that differs from the direction (e.g., the vertical direction) in which the first sidewall 110*a* is arranged.

The first bottom part 110*b* may be disposed in the middle area of the first sidewall 110*a* in the horizontal direction with respect to the first sidewall 110*a*. Alternatively, the first bottom part 110*b* may be horizontally disposed at a point biased upward by a pre-designed height based on a middle point of the first sidewall 110*a*. A portion of the display 150 (e.g., the left area of the display 150) may be disposed on the upper surface of the first bottom part 110*b*. The first bottom part 110*b* may have, on one side thereof, at least one first connecting hole 110*b*_2 vertically formed through the first bottom part 110*b*. A first connecting part 71*b* may be disposed in the first connecting hole 110*b*_2 and may connect the first connecting PCB 71*a* and the first printed circuit board 171 that are disposed on the upper surface and the lower surface of the first bottom part 110*b*, respectively.

According to various embodiments, the first connecting PCB 71*a* may be disposed to cover an opening (e.g., an upper opening) on one side of the first connecting hole 110*b*_2, and thus the electronic device 100 according to the embodiment may prevent an inflow of fluid through the first connecting hole 110*b*_2. In this regard, an adhesive layer having a waterproof function may be disposed between the first connecting PCB 71*a* and the periphery of the first connecting hole 110*b*_2. Alternatively, a peripheral portion of the first connecting PCB 71*a* that covers the first connecting hole 110*b*_2 may be formed of a material (e.g., rubber, a flexible plastic material, or an adhesive layer) that has a waterproof function. According to various embodiments, an additional adhesive layer having a waterproof function may be at least partially disposed between the first printed circuit board 171 and the periphery of the first connecting hole 110*b*_2.

The first hinge cover 110*c* may be provided at one end of the first bottom part 110*b* and may have a predetermined curvature. For example, in the illustrated drawing, the first hinge cover 110*c* may be provided at the right edge of the first bottom part 110*b* and may surround at least part of the outer surface of the hinge structure 130.

The second housing 120 may be formed in a shape that is the same as or similar to that of the first housing 110 and may be formed of a material that is the same as or similar to that of the first housing 110. For example, at least part of the second housing 120 may be formed of at least one of a metal material, a ceramic material, an injection-molded material (or an injection-molded structure), or a combination thereof. The second housing 120 may include the second sidewall 120*a*, a second bottom part 120*b*, and the second hinge cover 120*c*.

The second sidewall 120*a* may be disposed in a position opposite the first sidewall 110*a* with respect to the center of the display 150, for example, at the right edge of the display 150 in the illustrated drawing. The second sidewall 120*a* may have a predetermined length and width in the vertical direction and may be disposed such that at least part of the second sidewall 120*a* surrounds at least part of the right edge of the display 150.

The second bottom part 120*b* may be disposed at a predetermined position on the second sidewall 120*a* and may have a predetermined area and width in a direction (e.g., the horizontal direction) that differs from the direction (e.g., the vertical direction) in which the second sidewall 120*a* is arranged. For example, the second bottom part 120*b* may be disposed in a position that is symmetric to the first bottom part 110*b* with respect to the center of the display 150 in an unfolded state. Another portion of the display 150 (e.g., the right area of the display 150) may be disposed on the upper surface of the second bottom part 120*b*. The second bottom part 120*b* may have, on one side thereof, at least one second connecting hole 120*b*_2 vertically formed through the second bottom part 120*b*.

A second connecting part 72*b* may be disposed in the second connecting hole 120*b*_2 and may connect the second connecting PCB 72*a* and the second printed circuit board 172 that are disposed on the upper surface and the lower surface of the second bottom part 120*b*, respectively. The second connecting hole 120*b*_2 may be disposed, for example, in a position that is symmetric to the position where the first connecting hole 110*b*_2 is disposed. Alternatively, the second connecting hole 120*b*_2 may be formed in the second bottom part 120*b* so as to be biased toward the second hinge cover 120*c*.

According to various embodiments, similarly to the first connecting PCB 71*a*, the second connecting PCB 72*a* may be disposed to cover at least part of an opening on one side of the second connecting hole 120b_2 and may support a waterproof function for the second connecting hole 120b_2. In this regard, an adhesive layer having a waterproof function may be at least partially disposed between the periphery of the second connecting hole 120b_2 and the second connecting PCB 72a. According to various embodiments, an adhesive layer having a waterproof function may be additionally disposed between the second printed circuit board 172 and the periphery of the second connecting hole 120b_2.

The second hinge cover 120c may be provided at one end of the second bottom part 120b and may have a predetermined curvature. For example, in the illustrated drawing, the second hinge cover 120c may be provided at the left edge of the second bottom part 120b and may surround at least part of the outer surface of the hinge structure 130. At least part of the first hinge cover 110c and at least part of the second hinge cover 120c may be disposed to face each other. The first hinge cover 110c and the second hinge cover 120c may be provided having a half-pipe type and may be disposed to have a gap in the middle between the first hinge cover 110c and the second hinge cover 120c. Accordingly, when the display 150 is in a folded state, the first hinge cover 110c and the second hinge cover 120c may be separated from each other, and at least part of the exterior of the hinge structure 130 disposed inward of the first hinge cover 110c and the second hinge cover 120c may be exposed to the outside.

At least part of the first printed circuit board 171 may be disposed in a predetermined area inside the first housing 110. For example, the first printed circuit board 171 may be disposed on one side of the rear surface of the first bottom part 110b. At least one part for driving the display 150 may be mounted on the first printed circuit board 171. Alternatively, a part (e.g., at least one of the communication circuitry, the antenna, or a sensor) that is disposed in the first housing 110 may be mounted on the first printed circuit board 171. The first printed circuit board 171 may be electrically connected with the second printed circuit board 172 through the connecting PCBs 71a and 72a. One side of the first printed circuit board 171 may be disposed to close one end of the first connecting hole 110b_2 vertically formed through the first bottom part 110b (e.g., one end directed toward the rear surface of the first bottom part 110b). For example, in FIG. 2, at least one surface of the right side of the first printed circuit board 171 may be disposed to face the lower side of the first connecting hole 110b_2 and may close the lower side of the first connecting hole 110b_2.

At least part of the second printed circuit board 172 may be disposed in a predetermined area inside the second housing 120. For example, at least part of the second printed circuit board 172 may be disposed on one side of the rear surface of the second bottom part 120b. The second printed circuit board 172 may include at least one part for driving the display 150 or a separately provided auxiliary display. Alternatively, a part (e.g., at least one of short-range communication circuitry, a short-range communication antenna, a rear camera, or a sensor) that is disposed in the second housing 120 may be mounted on the second printed circuit board 172. The second printed circuit board 172 may be electrically connected with the first printed circuit board 171 through the connecting PCBs 71a and 72a and the first flexible PCB 50. One side of the second printed circuit board 172 may be disposed to close one end of the second connecting hole 120b_2 vertically formed through the second bottom part 120b (e.g., one end directed toward the rear surface of the second bottom part 120b).

The first connecting hole 110b_2 may be vertically formed through one side of the first bottom part 110b. For example, the first connecting hole 110b_2 may be provided on the one side of the first bottom part 110b and may be formed to be biased toward the first hinge cover 110c. In the illustrated drawing, the upper opening of the first connecting hole 110b_2 may be closed by at least part of the first connecting PCB 71a. The lower opening of the first connecting hole 110b_2 may be closed by at least part of the first printed circuit board 171. A first protrusion 110b_1 may be provided inside the first connecting hole 110b_2. The first protrusion 110b_1 may protrude in a direction away from the inner wall of the first connecting hole 110b_2 and may have a predetermined height. A first waterproof member 41 may be disposed on an upper portion of the first protrusion 110b_1, and a second waterproof member 42 may be disposed on a lower portion of the first protrusion 110b_1. At least part of the first waterproof member 41 may be disposed to face one surface of the first connecting PCB 71a. At least part of the second waterproof member 42 may be disposed to face one surface of the first printed circuit board 171.

The second connecting hole 120b_2 may be provided on one side of the second bottom part 120b and may be formed to be biased toward the second hinge cover 120c. In the illustrated drawing, the upper opening of the second connecting hole 120b_2 may be closed by at least part of the second connecting PCB 72a, and the lower opening of the second connecting hole 120b_2 may be closed by at least part of the second printed circuit board 172. A second protrusion 120b_1 may be provided inside the second connecting hole 120b_2. The second protrusion 120b_1 may protrude from the inner wall of the second connecting hole 120b_2 and may have a predetermined height. A third waterproof member 51 may be disposed on an upper portion of the second protrusion 120b_1, and a fourth waterproof member 52 may be disposed on a lower portion of the second protrusion 120b_1. At least part of the third waterproof member 51 may be disposed to face one surface of the second connecting PCB 72a. At least part of the fourth waterproof member 52 may be disposed to face one surface of the second printed circuit board 172. According to various embodiments, in the case where at least one of the first connecting PCB 71a or the second connecting PCB 72a includes an adhesive layer to have a waterproof function while closing the connecting holes 110b_2 and 120b_2, at least one of the first to fourth waterproof members 41, 42, 51, or 52 may be omitted. Alternatively, the electronic device 100 according to various embodiments may include the first to fourth waterproof members 41, 42, 51, and 52, thereby further improving a waterproof function.

The first connecting part 71b may include at least one interconnection wire that electrically connects the first connecting PCB 71a and the first printed circuit board 171, and a substrate or structure on which the interconnection wire is disposed. The first connecting part 71b may be disposed to pass through the first connecting hole 110b_2. The upper surface of the first connecting part 71b may be connected to the first connecting PCB 71a, and the lower surface of the first connecting part 71b may be connected to the first printed circuit board 171.

The first waterproof member 41 may be disposed at a location where the first connecting part 71b and the first connecting PCB 71a are connected, and may block an inflow of fluid from the outside. The second waterproof member 42 may be disposed at a location where the first connecting part 71b and the first printed circuit board 171 are connected, and may block an inflow of fluid from the outside. The first waterproof member 41 and the second waterproof member 42 may have a ring shape and may be respectively disposed on the upper surface and the lower surface of the first protrusion 110b_1. The first waterproof member 41 or the second waterproof member 42 may have a thickness that is the same as or greater than the height from the upper surface of the first protrusion 110b_1 to the open side of the first connecting hole 110b_2. The first waterproof member 41 and the second waterproof member 42 may be formed of a rubber material, a polymer material, a flexible plastic material, or a combination thereof.

The second connecting part 72b may include at least one interconnection wire that electrically connects the second connecting PCB 72a and the second printed circuit board 172, and a substrate or structure on which the interconnection wire is disposed. The second connecting part 72b may be formed of a material that is the same as or similar to that of the first connecting part 71b and may be disposed in a structure that is the same as or similar to the structure in which the first connecting part 71b is disposed. For example, at least part of the second connecting part 72b may be disposed to pass through the second connecting hole 120b_2. The upper surface of the second connecting part 72b may be connected to the second connecting PCB 72a, and the lower surface of the second connecting part 72b may be connected to the second printed circuit board 172.

The third waterproof member 51 may be disposed at a location where the second connecting part 72b and the second connecting PCB 72a are connected, and may block an inflow of fluid from the outside. The fourth waterproof member 52 may be disposed at a location where the second connecting part 72b and the second printed circuit board 172 are connected, and may block an inflow of fluid from the outside. The third waterproof member 51 and the fourth waterproof member 52 may have a ring shape and may be respectively disposed on the upper surface and the lower surface of the second protrusion 120b_1. The third waterproof member 51 or the fourth waterproof member 52 may be provided to be the same as or similar to the first waterproof member 41 or the second waterproof member 42 mentioned above. For example, the thickness of the third waterproof member 51 or the fourth waterproof member 52 may be the same as or greater than the height from the upper surface of the second protrusion 120b_1 to the open side of the second connecting hole 120b_2. The third waterproof member 51 and the fourth waterproof member 52 may be formed of a rubber material, a polymer material, a flexible plastic material, or a combination thereof.

The hinge structure 130 may be disposed in the central area where the first housing 110 and the second housing 120 meet each other, with the display 150 unfolded. The hinge structure 130 may include, for example, one side coupled with the first housing 110, an opposite side coupled with the second housing 120, and at least one gear provided such that the first housing 110 or the second housing 120 is rotatable. At least part of the interior of the hinge structure 130 may be empty, and at least part of the first flexible PCB 50 may be disposed in the empty cavity. One side of the first flexible PCB 50 may be connected with, for example, the first connecting PCB 71a connected with the first printed circuit board 171 through the first connecting part 71b. An opposite side of the first flexible PCB 50 may be connected with the second connecting PCB 72a connected with the second printed circuit board 172 through the second connecting part 72b. For example, the first flexible PCB 50 may transmit a signal generated from a part disposed on the first printed circuit board 171 to the second connecting PCB 72a, or may transmit a signal generated from a part disposed on the second printed circuit board 172 to the first connecting PCB 71a. The at least part of the first flexible PCB 50 may be disposed inside the hinge structure 130 in a state of being bent at a predetermined angle depending on the shape of the inside of the hinge structure 130.

As described above, the electronic device 100 according to an embodiment may include the first housing 110, the second housing 120, and the hinge structure 130 connecting the first housing 110 and the second housing 120. In an environment in which the first flexible PCB 50 connecting the first housing 110 and the second housing 120 is disposed, the electronic device 100 may seal the opening of the first connecting hole 110b_2 of the first housing 110 in which a portion of the first flexible PCB 50 is disposed and the opening of the second connecting hole 120b_2 of the second housing 120 in which another portion of the first flexible PCB 50 is disposed. Accordingly, the above-described electronic device 100 may perform a waterproof function to prevent fluid introduced from the outside from diffusing into the first housing 110 or the second housing 120.

Although it has been described that both the first housing 110 and the second housing 120 include the connecting holes, respectively, and the waterproof function is supported by closing the connecting holes, the disclosure is not limited thereto. For example, at least part of the waterproof structure may be applied to only the first housing 110, or may be applied to only the second housing 120.

Figure 3:
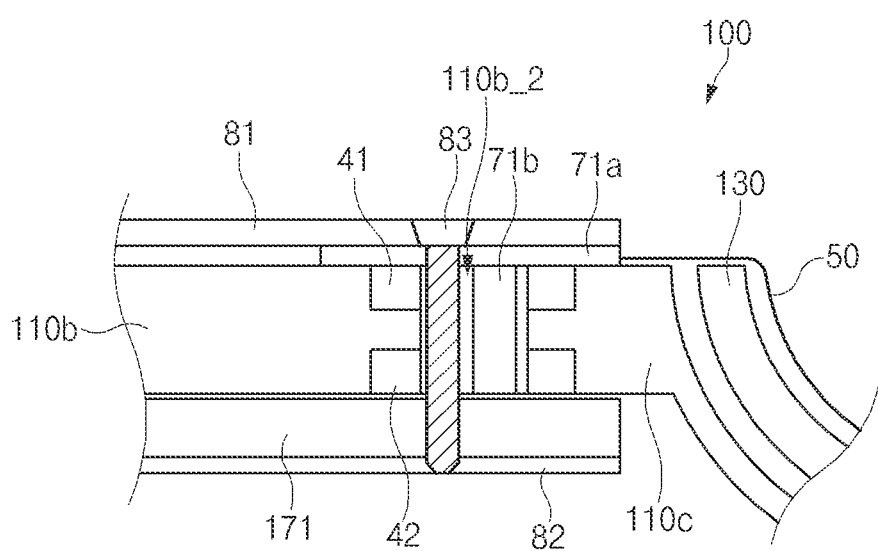
FIG. 3 is a view illustrating another example of a waterproof structure of an electronic device according to an embodiment of the disclosure.

FIG. 3 is a view illustrating another example of a waterproof structure of an electronic device according to an embodiment of the disclosure.

Referring to FIGS. 2 and 3, at least part of the electronic device 100 may include the first housing 110 and the hinge structure 130 connected with one side of the first housing 110, and the first housing 110 may include the first bottom part 110b extending from the first sidewall 110a and the first hinge cover 110c connected to the first bottom part 110b. The first flexible PCB 50 may be disposed inward of the hinge structure 130 of the electronic device 100. One side of the first flexible PCB 50 may be connected to the first connecting PCB 71a.

The first bottom part 110b may have the first connecting hole 110b_2 on one side thereof. The electronic device 100 may include the first connecting PCB 71a that covers the upper opening of the first connecting hole 110b_2 and the first printed circuit board 171 that covers the lower opening of the first connecting hole 110b_2. The first connecting part 71b connecting the first connecting PCB 71a and the first printed circuit board 171 may be disposed in the first connecting hole 110b_2.

According to various embodiments, the electronic device 100 may include a front bracket 81 disposed on the upper surface of the first connecting PCB 71a, a rear bracket 82 disposed on the rear surface of the first printed circuit board 171, and a coupling member 83 that passes through one side of the front bracket 81 and that is coupled with at least part of the rear bracket 82, with at least part of the coupling member 83 located in the first connecting hole 110b_2. The front bracket 81 may include an insertion hole into which the coupling member 83 is inserted. The rear bracket 82 may include an insertion hole into which an end of the coupling member 83 is screwed or riveted. In the case where the coupling member 83 is of a screw type, a thread may be formed on at least part of the inner wall of the insertion hole.

In the above-described structure of the electronic device 100, the front bracket 81 may be provided on the upper surface of the first connecting PCB 71a, the rear bracket 82 may be provided on the rear surface of the first printed circuit board 171, and the coupling member 83 may be coupled to fasten the front bracket 81 and the rear bracket 82. In this case, the first connecting PCB 71a and the first printed circuit board 171 may more tightly seal the openings or gaps of the first connecting hole 110b_2. Although it has been described that the front bracket 81 and the rear bracket 82 are separately provided and the coupling member 83 fastens the front bracket 81 and the rear bracket 82, the disclosure is not limited thereto. For example, the electronic device 100 may have a structure not including the front bracket 81 and the rear bracket 82. In this case, the coupling member 83 may directly fasten the first connecting PCB 71a and the first printed circuit board 171. In this regard, the first connecting PCB 71a and the first printed circuit board 171 may have predetermined strengths to withstand pressure applied while or after the coupling member 83 is coupled. For example, at least part of the first connecting PCB 71a and the first printed circuit board 171 may be formed of a metal material.

Figure 4A:
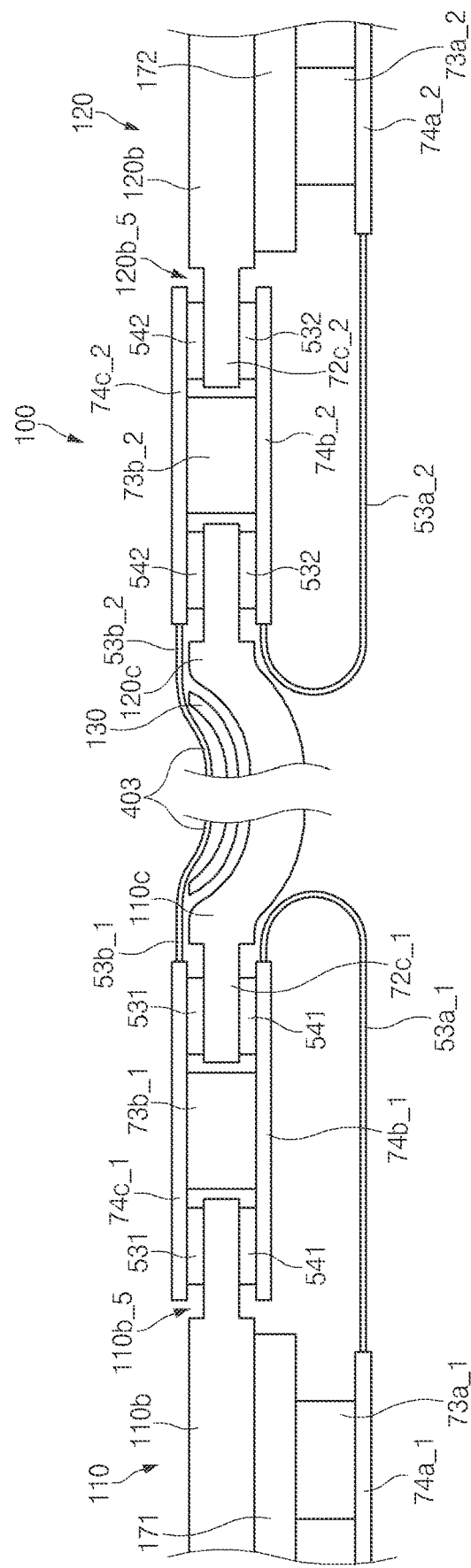
FIG. 4A is a view illustrating a first different form of a waterproof structure according to an embodiment of the disclosure.

FIG. 4A is a view illustrating a first different form of a waterproof structure according to an embodiment of the disclosure.

Figure 4B:
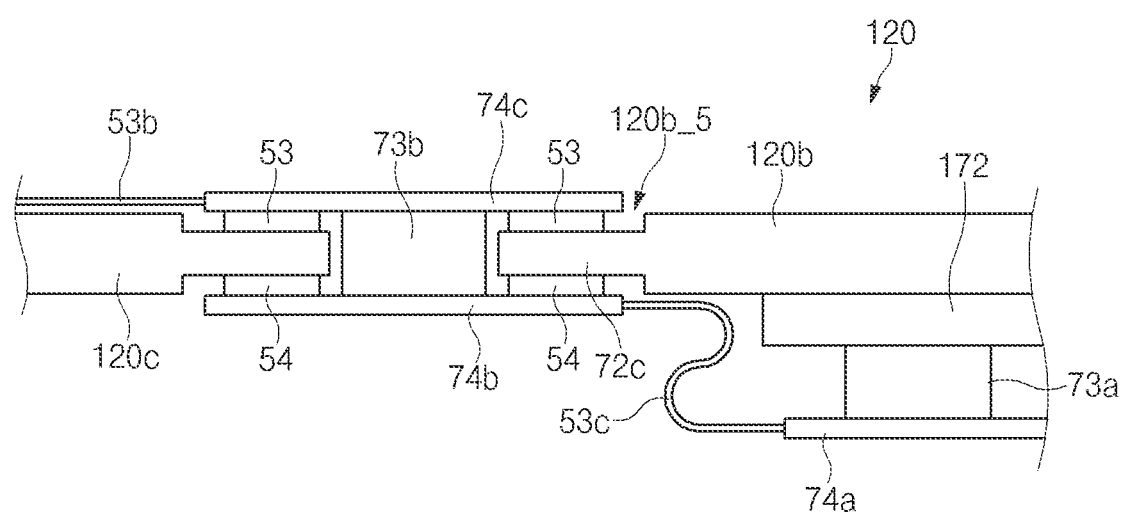
FIG. 4B is a view illustrating a second different form of a waterproof structure according to an embodiment of the disclosure.

FIG. 4B is a view illustrating a second different form of a waterproof structure according to an embodiment of the disclosure.

Referring to FIG. 4B, a partial area where the second housing 120 is disposed on the right side of the electronic device 100 is illustrated. FIGS. 4A and 4B may be examples of the section taken along line A-A' of FIG. 1.

Referring to FIG. 4A, at least part of the electronic device 100 according to an embodiment may include the first housing 110 and the second housing 120 and may include a connecting part 403 that connects the first housing 110 and the second housing 120. At least part of the connecting part 403 may be disposed on one side of the hinge structure 130.

The first housing 110 may include the first bottom part 110b, the first hinge cover 110c, the first printed circuit board 171, a first opening 110b_5, a first connector (e.g., 74b_1, 73b_1, 74c_1, and a flexible PCB 53b_1), and a first portion 73a_1, 74a_1, and 53a_1 extending between the first printed circuit board 171 and the first connector (e.g., 74b_1, 73b_1, and 74c_1).

The second housing 120 may include the second bottom part 120b, the second hinge cover 120c, the second printed circuit board 172, a second opening 120b_5, a second connector (e.g., 74b_2, 73b_2, and 74c_2), and a second portion 73a_2, 74a_2, and 53a_2 extending between the second printed circuit board 172 and the second connector (e.g., 74b_2, 73b_2, and 74c_2). The connecting part 403 may be a third portion that connects the first portion and the second portion.

Some structures of the electronic device 100 will be described based on the second housing 120. The second housing 120 may include the second bottom part 120b, the second hinge cover 120c, the second printed circuit board 172, the third connecting PCB 74a_2, the fourth connecting PCB 74b_2, the fifth connecting PCB 74c_2, the second flexible PCB 53a_2, and a third flexible PCB 53b_2.

In the illustrated drawing, the sidewall (not illustrated) may be disposed on the right side of the second bottom part 120b, and the second hinge cover 120c may be disposed on the left side of the second bottom part 120b. The display may be disposed on the upper surface of the second bottom part 120b. The second printed circuit board 172 may be disposed on the lower surface of the second bottom part 120b and may be connected with the third connecting PCB 74a_2 through the third connecting part 73a_2. One side of the second flexible PCB 53a_2 may be connected to one side of the third connecting PCB 74a_2, and an opposite side of the second flexible PCB 53a_2 may be bent in the shape of a "U" and may be connected to one side of the fourth connecting PCB 74b_2. The fourth connecting PCB 74b_2 may be disposed to cover one opening of the second opening 120b_5 formed in the second bottom part 120b, and the fifth connecting PCB 74c_2 may be disposed to cover an opposite opening of the second opening 120b_5 formed in the second bottom part 120b. The fourth connecting part 73b_2 may electrically connect the fourth connecting PCB 74b_2 and the fifth connecting PCB 74c_2. A first protruding structure 72c_2 may be provided in the second opening 120b_5 formed in the second bottom part 120b and may be higher than the surface of the inner wall of the second opening 120b_5 by a specified height. A step may be formed in the second opening 120b_5 by the first protruding structure 72c_2 provided in the second opening 120b_5, and waterproof members may be disposed on the step. For example, a fifth waterproof member 532 may be disposed between a first surface of the first protruding structure 72c_2 and the fourth connecting PCB 74b_2, and a sixth waterproof member 542 may be disposed between a second surface (e.g., the surface opposite to the first surface) of the first protruding structure 72c_2 and the fifth connecting PCB 74c_2. The fifth waterproof member 532 and the sixth waterproof member 542 may have a ring shape and may be disposed on the first protruding structure 72c_2.

According to various embodiments, an adhesive layer or an adhesive member may be disposed between the fifth waterproof member 532 and the fourth connecting PCB 74b_2 and between the sixth waterproof member 542 and the fifth connecting PCB 74c_2 to fix the fourth connecting PCB 74b_2 and the fifth connecting PCB 74c_2. Alternatively, an adhesive layer or an adhesive member may be disposed between the fourth connecting part 73b_2 and the fourth connecting PCB 74b_2 or between the fourth connecting part 73b_2 and the fifth connecting PCB 74c_2. According to various embodiments, an adhesive layer or an adhesive member may be disposed between the third connecting part 73a_2 and the third connecting PCB 74a_2 or between the third connecting part 73a_2 and the second printed circuit board 172. According to various embodiments, one side of the third flexible PCB 53b_2 may be connected to one side of the fifth connecting PCB 74c_2. The third flexible PCB 53b_2 may be disposed inward of the hinge structure 130 in a state of being bent at a predetermined angle.

Although some structures of the second housing 120 have been described above, the above-described structures may be provided in the first housing 110 in the same structures and shapes. For example, a second protruding structure 72c_1 may be disposed in the first housing 110, a waterproof member 531 may be disposed on the upper surface of the second protruding structure 72c_1, and a waterproof member 541 may be disposed on the lower surface of the second protruding structure 72c_1. The waterproof members 531 and 541 may have a ring shape and may be disposed on the second protruding structure 72c_1.

The second flexible PCB 53a_2 illustrated in FIG. 4A may be connected with the one side (e.g., the side surface directed toward the second hinge cover 120c) of the fourth connecting PCB 74b_2, and therefore pressure applied to the second flexible PCB 53a_2 may be reduced, which makes it possible to ensure the stability of connection with the fourth connecting PCB 74b_2.

Referring to FIG. 4B, at least part of the electronic device 100 according to an embodiment may include the second bottom part 120*b*, the second hinge cover 120*c*, the second printed circuit board 172, an eighth connecting PCB 74*a*, a ninth connecting PCB 74*b*, a tenth connecting PCB 74*c*, a fourth flexible PCB 53*b*, and a fifth flexible PCB 53*c* that are included in the second housing 120. Here, configurations of the second bottom part 120*b*, the second hinge cover 120*c*, the second printed circuit board 172, the eighth connecting PCB 74*a*, the ninth connecting PCB 74*b*, the tenth connecting PCB 74*c*, and the fourth flexible PCB 53*b* (e.g., waterproof members 53 and 54, a protruding structure 72*c*, a connector 73*b*, a second portion 73*a*, etc.) may be substantially the same as, or similar to, the configurations described above with reference to FIG. 4A.

For example, one side of the fifth flexible PCB 53*c* may be connected with one side of the eighth connecting PCB 74*a*, and an opposite side of the fifth flexible PCB 53*c* may be connected with one side of the ninth connecting PCB 74*b*. Here, the opposite side of the fifth flexible PCB 53*c* may be connected to a side surface of the one side of the ninth connecting PCB 74*b* that is close to the second bottom part 120*b*. In this regard, the fifth flexible PCB 53*c* may be bent in the shape of an "S". With regard to an arrangement of the fifth flexible PCB 53*c* in the shape of an "S", one side of the second bottom part 120*b* may be formed with a step as illustrated.

In the above-described structure illustrated in FIG. 4B, the fifth flexible PCB 53*c* may be disposed close to the ninth connecting PCB 74*b*, and thus the fifth flexible PCB 53*c* may be formed to be shorter than the second flexible PCB 53*a*_2.

Figure 4C:
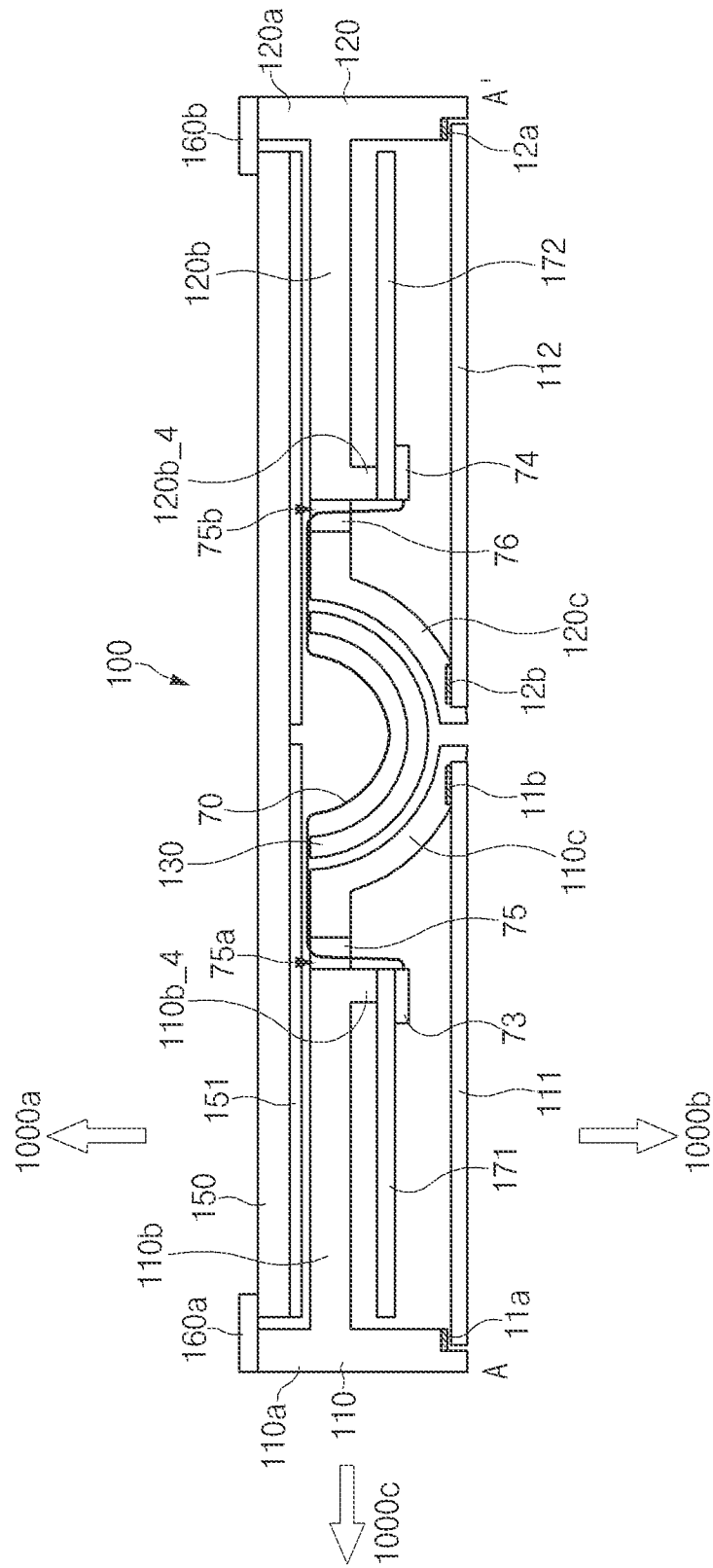
FIG. 4C is a view illustrating a third different form of a waterproof structure according to an embodiment of the disclosure.

FIG. 4C is a view illustrating a third different form of a waterproof structure according to an embodiment of the disclosure. FIG. 4C may be another example of the section taken along line A-A' of FIG. 1.

Referring to FIG. 4C, at least part of the electronic device 100 according to an embodiment may include the first housing 110, the second housing 120, the hinge structure 130, the display 150, the rear side part 151, the rear panels 111 and 112, the first bezel 160*a*, and the second bezel 160*b*. Furthermore, the at least part of the electronic device 100 may include the first printed circuit board 171, the second printed circuit board 172, a sixth flexible PCB 70, a sixth connecting PCB 73, and a seventh connecting PCB 74.

The first housing 110 may include the first sidewall 110*a*, the first bottom part 110*b*, the first hinge cover 110*c*, and a fourth connecting hole 75*a*, and a first waterproof structure 75.

For example, the first sidewall 110*a* may be formed to have a predetermined width and height in the vertical direction in the illustrated drawing. The first bezel 160*a* may be disposed on an upper end of the first sidewall 110*a* and may protect the edge of the display 150, at least part of which is seated on the first bottom part 110*b*. The first bottom part 110*b* may be disposed at a predetermined height on the first sidewall 110*a* and may have a predetermined area in a direction that differs from the direction in which the first sidewall 110*a* is formed. The display 150 may be disposed on the upper surface of the first bottom part 110*b*, and the first printed circuit board 171 may be disposed on the lower surface of the first bottom part 110*b*. According to various embodiments, at least one third protruding structure 110*b*_4 may be disposed on the lower surface of the first bottom part 110*b*. At least part of the first printed circuit board 171 may be fixed to the third protruding structure 110*b*_4. For example, one end of the right edge of the first printed circuit board 171 may be fixed to one surface of the third protruding structure 110*b*_4. Accordingly, the at least part of the first printed circuit board 171 may be spaced apart from the lower surface of the first bottom part 110*b* by a predetermined gap. The sixth connecting PCB 73 may be placed on at least one side of the lower surface of the first printed circuit board 171. The sixth connecting PCB 73 may be connected with one side of the sixth flexible PCB 70.

The fourth connecting hole 75*a* may be vertically formed through the first bottom part 110*b*. The first waterproof structure 75 may be disposed to fill at least part of the fourth connecting hole 75*a*. At least part of the sixth flexible PCB 70 may be disposed inward of the first waterproof structure 75. The first waterproof structure 75 may be formed of a material (e.g., rubber) with elasticity and may thus prevent an inflow of fluid from the top side to the bottom side of the fourth connecting hole 75*a* even though the sixth flexible PCB 70 is disposed inward of the first waterproof structure 75. In this regard, at least part of the first waterproof structure 75 may have a diameter that is the same as or greater than the diameter of the fourth connecting hole 75*a*, and may be press fitted into the fourth connecting hole 75*a*.

The second housing 120 may include the second sidewall 120*a*, the second bottom part 120*b*, the second hinge cover 120*c*, a fifth connecting hole 75*b*, and a second waterproof structure 76.

The second sidewall 120*a* may be symmetric to the first sidewall 110*a*, and the second bezel 160*b* may be disposed on an upper end of the second sidewall 120*a*. The second bezel 160*b* may protect the edge of the display 150 seated on the second bottom part 120*b*. The second bottom part 120*b* may be provided similarly to the first bottom part 110*b*. The display 150 may be disposed on the upper surface of the second bottom part 120*b*, and the second printed circuit board 172 may be disposed on the lower surface of the second bottom part 120*b*. According to various embodiments, at least one fourth protruding structure 120*b*_4 may be disposed on the lower surface of the second bottom part 120*b*. At least part of the second printed circuit board 172 may be fixed to the fourth protruding structure 120*b*_4. Accordingly, the at least part of the second printed circuit board 172 may be spaced apart from the lower surface of the second bottom part 120*b* by a predetermined gap. The seventh connecting PCB 74 may be placed on at least one side of the lower surface of the second printed circuit board 172. The seventh connecting PCB 74 may be connected with an opposite side of the sixth flexible PCB 70.

The fifth connecting hole 75*b* may be vertically formed through the second bottom part 120*b*. The second waterproof structure 76 may be disposed to fill at least part of the fifth connecting hole 75*b*. At least part of the sixth flexible PCB 70 may be disposed inward of the second waterproof structure 76. With regard to prevention of an inflow of fluid from the top side to the bottom side of the fifth connecting hole 75*b*, the second waterproof structure 76 may be formed of a material with elasticity (e.g., at least one of rubber, flexible plastic, dispensing, bonding, a polymer, or a combination thereof). The second waterproof structure 76 may have the same shape and size as the first waterproof structure 75 and may be seated in the fifth connecting hole 75*b*.

The one side of the sixth flexible PCB 70 may be connected to the first printed circuit board 171 through the sixth connecting PCB 73 and may be disposed inward of the hinge structure 130 through the first waterproof structure 75. The opposite side of the sixth flexible PCB 70 may be connected to the second printed circuit board 172 through the seventh connecting PCB 74 and may be disposed inward of the hinge structure 130 through the second waterproof structure 76.

According to various embodiments, the electronic device 100 may further include the first rear waterproof member 11a disposed between the first rear panel 111 and the first sidewall 110a and the first cover waterproof member 11b disposed between the first rear panel 111 and the first hinge cover 110c. Furthermore, the electronic device 100 may further include the second rear waterproof member 12a disposed between the second rear panel 112 and the second sidewall 120a and the second cover waterproof member 12b disposed between the second rear panel 112 and the second hinge cover 120c.

In the above-described electronic device 100, the first waterproof structure 75 and the second waterproof structure 76 may be disposed in the fourth connecting hole 75a and the fifth connecting hole 75b in which the sixth flexible PCB 70 is disposed, thereby preventing fluid from being introduced toward the printed circuit boards 171 and 172, which in turn provides a stable waterproof function.

Figure 5:
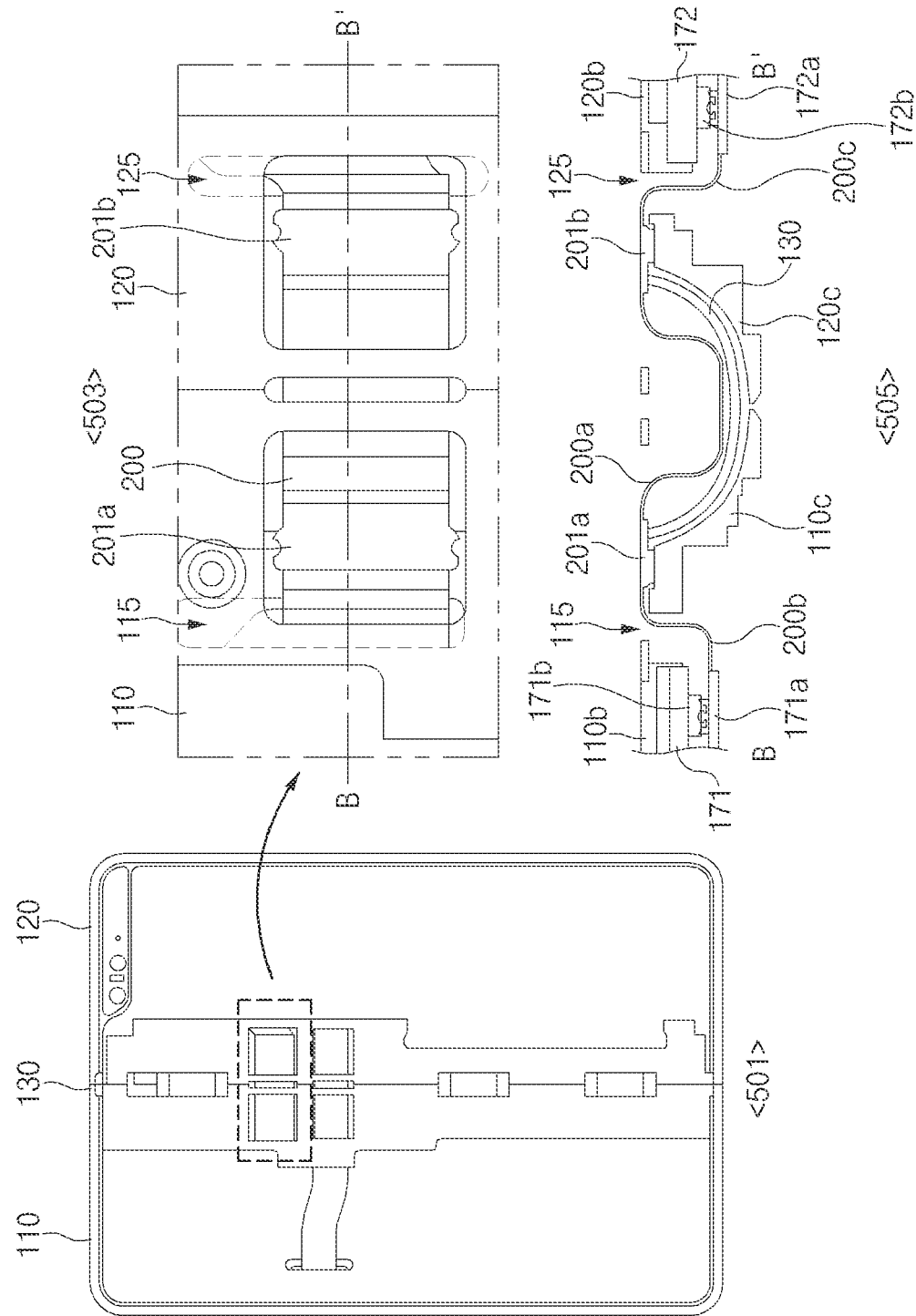
FIG. 5 is a view illustrating one form of an electronic device according to an embodiment of the disclosure.

FIG. 5 is a view illustrating one form of an electronic device according to an embodiment of the disclosure.

Figure 6:
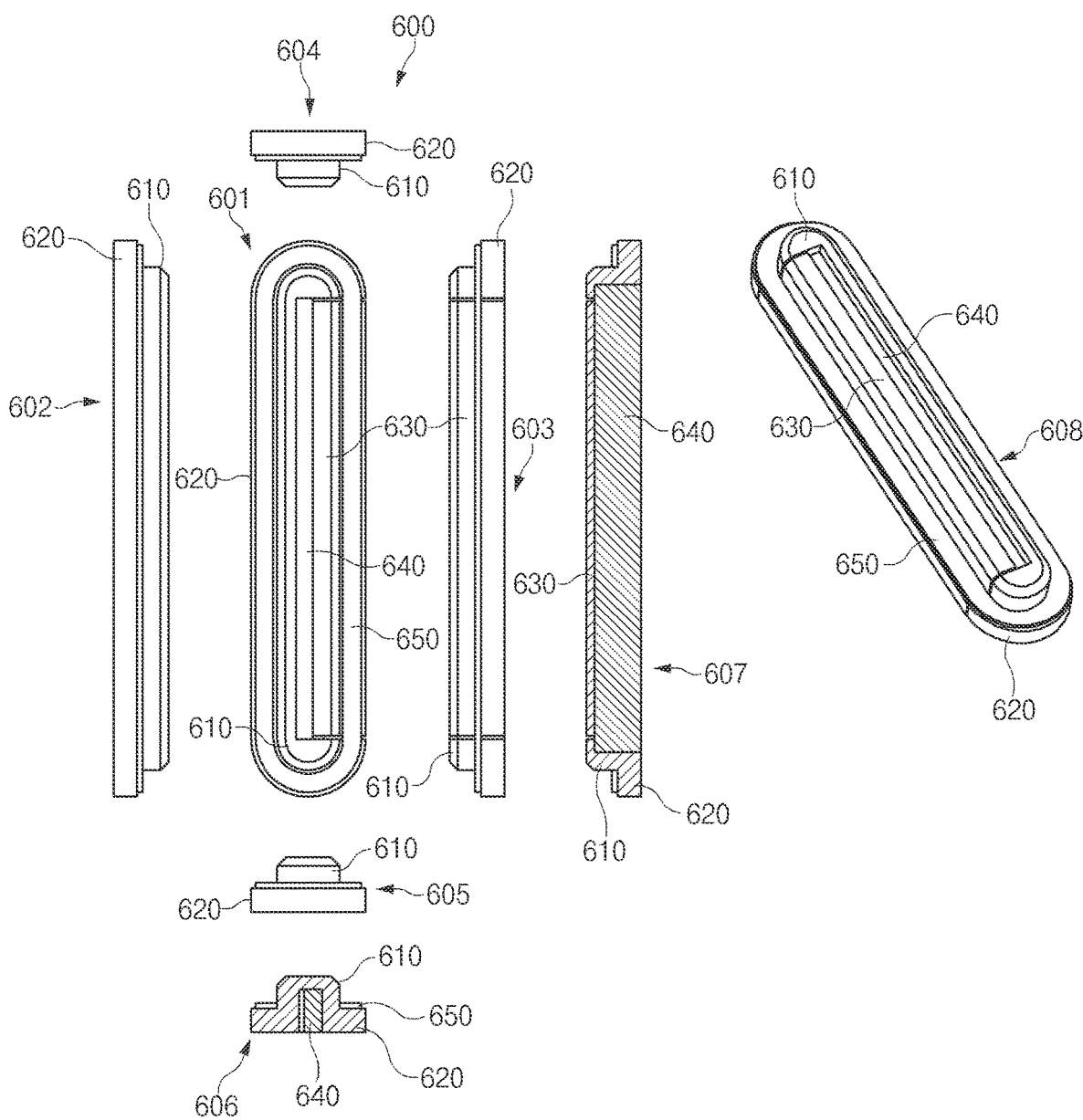
FIG. 6 is a view illustrating an example of a waterproof packing structure according to an embodiment of the disclosure.

FIG. 6 is a view illustrating an example of a waterproof packing structure according to an embodiment of the disclosure.

Figure 7:
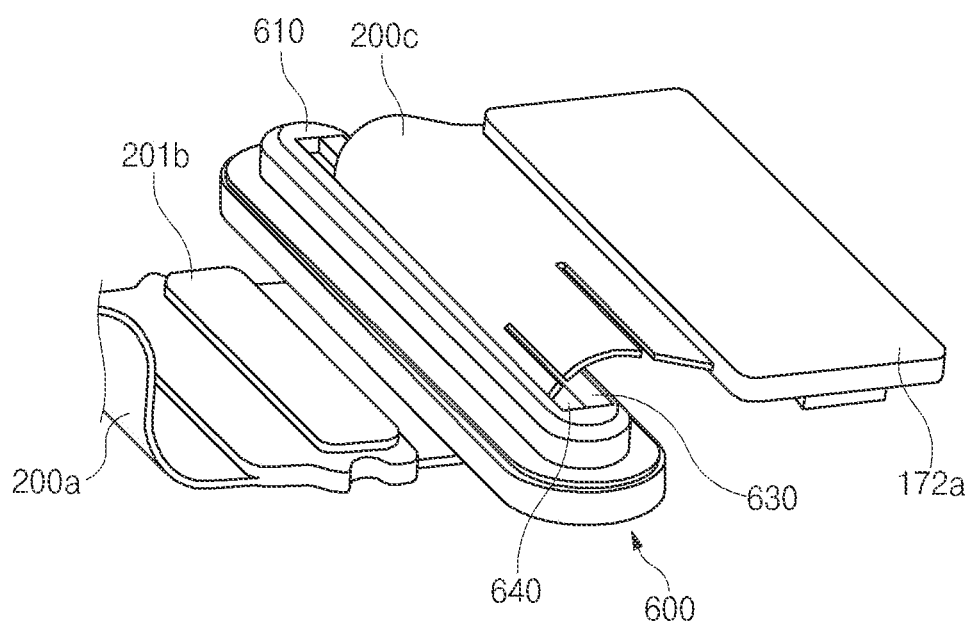
FIG. 7 is a view illustrating a structure in which a sixth flexible printed circuit board (FPCB) is inserted into a waterproof packing structure according to an embodiment of the disclosure.

FIG. 7 is a view illustrating a structure in which a sixth flexible PCB is inserted into a waterproof packing structure according to an embodiment of the disclosure.

Figure 8:
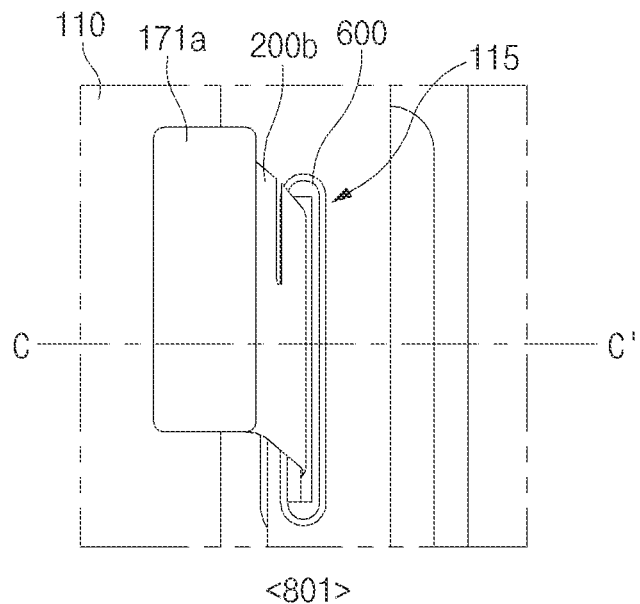
FIG. 8 is a view illustrating structures of an electronic device in which a waterproof packing structure is disposed, according to an embodiment of the disclosure.
Figure 8:
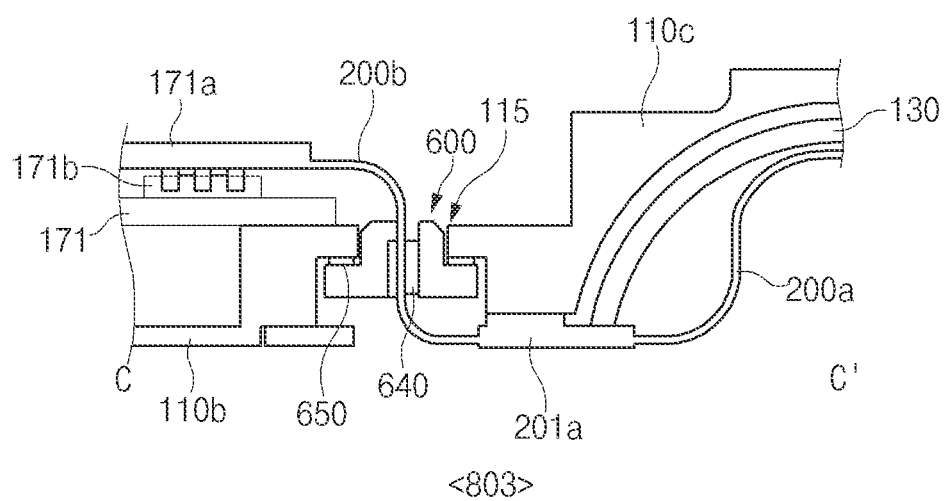

FIG. 8 is a view illustrating structures of an electronic device in which the waterproof packing structure is disposed, according to an embodiment of the disclosure.

Referring to FIG. 5, state 501 illustrates a state in which the display and the bezel (e.g., a structure covering the edge of the display) are removed from the electronic device 100 according to various embodiments. State 503 illustrates a blowup of the area where a seventh flexible PCB 200 is disposed in state 501, and state 505 illustrates a section taken along line B-B' in state 503. Referring to states 501, 503, and 505, the electronic device 100 according to various embodiments may include the first housing 110, the second housing 120, and the hinge structure 130 and may include at least one seventh flexible PCB 200 disposed across the first housing 110, the second housing 120, and the hinge structure 130.

The first housing 110 may have, in the first sidewall 110b, a sixth connecting hole 115 in which one side (e.g., a first sub-FPCB 200b) of the seventh flexible PCB 200 is mounted, and the second housing 120 may have, in the second sidewall 120b, a seventh connecting hole 125 in which an opposite side (e.g., a second sub-FPCB 200c) of the seventh flexible PCB 200 is mounted. A central FPCB 200a of the seventh flexible PCB 200 may be disposed inward of the hinge structure 130. The first hinge cover 110c that is a portion of the first housing 110 and the second hinge cover 120c that is a portion of the second housing 120 may be disposed on the exterior of the hinge structure 130. A first PCB fixing part 201a for fixing the first sub-FPCB 200b of the seventh flexible PCB 200 may be disposed on one side of the first hinge cover 110c. The first PCB fixing part 201a may have, on the central portion, a bumpy structure into which a hook or a protrusion is fixedly inserted. In this regard, the first hinge cover 110c may have, in a predetermined area on the upper side thereof, a hook or a protrusion on which the first PCB fixing part 201a is temporarily or semi-permanently fixedly mounted.

A second PCB fixing part 201b for fixing the second sub-FPCB 200c of the seventh flexible PCB 200 may be disposed on one side of the second hinge cover 120c. Correspondingly, the second hinge cover 120c may have, on the one side thereof, a hook or a protrusion that is coupled with the second PCB fixing part 201b. An eleventh connecting PCB 171a may be disposed at an end of the first sub-FPCB 200b, and a twelfth connecting PCB 172a may be disposed at an end of the second sub-FPCB 200c. The eleventh connecting PCB 171a may be connected with the first printed circuit board, which has been described above with reference to FIG. 2, through a first connector 171b, and the twelfth connecting PCB 172a may be connected with the second printed circuit board 172 through a second connector 172b.

At least one of the first PCB fixing part 201a or the second PCB fixing part 201b may be formed of a material (e.g., a plastic material, wood, or a polymer material) that has a higher strength than the FPCBs 200a, 200b, and 200c by a specified magnitude or more.

Referring to FIG. 6, a first waterproof packing structure 600 may be fixedly inserted into the sixth connecting hole 115 and the seventh connecting hole 125 described above in connection with the electronic device 100. The sixth connecting hole 115 and the seventh connecting hole 125 may each include an upper opening and a lower opening that have different sizes, so as to prevent the first waterproof packing structure 600 from being separated in one direction (e.g., the upper direction in the illustrated drawing) after being seated in the sixth connecting hole 115 and the seventh connecting hole 125. For example, the sixth connecting hole 115 and the seventh connecting hole 125 may include a cavity with a predetermined size and a cover that covers the upper opening of the cavity and that has an opening formed therein such that a portion of an upper end of the first waterproof packing structure 600 is exposed to the outside.

In FIG. 6, state 601 illustrates the front side of the first waterproof packing structure 600, state 602 illustrates the left side of the first waterproof packing structure 600, and state 603 illustrates the right side of the first waterproof packing structure 600. States 604 and 605 illustrate the upper side and the lower side of the first waterproof packing structure 600, and state 606 illustrates a cross-sectional view of the first waterproof packing structure 600. State 607 illustrates a longitudinal sectional view of the first waterproof packing structure 600, and state 608 illustrates a perspective view of the first waterproof packing structure 600.

As illustrated in states 601 to 608, the first waterproof packing structure 600 may include a support bracket 620, a sub-bracket 610, a mounting part 630, and a water-infiltration preventing part 640. The support bracket 620 may be formed to be larger than the upper opening area of the sixth connecting hole 115 or the seventh connecting hole 125 that is formed in the first housing 110 or the second housing 120 of the electronic device 100. For example, the support bracket 620 may be seated in the sixth connecting hole 115 or the seventh connecting hole 125. An upward movement of the support bracket 620 may be restricted by the cover provided on the upper side of the sixth connecting hole 115 or the seventh connecting hole 125. The support bracket 620 may have, for example, an oval or rectangular shape, the vertical axis of which is longer than the horizontal axis. In the case where the support bracket 620 is provided in a rectangular shape, the support bracket 620 may have rounded corners. The support bracket 620 may include a predetermined space therein, in which the water-infiltration preventing part 640 is disposed.

The sub-bracket 610 may extend upward from the support bracket 620 by a specified height and may have a smaller area than the support bracket 620. When the first waterproof packing structure 600 is seated in the sixth connecting hole 115 or the seventh connecting hole 125, at least part of the sub-bracket 610 may be mounted in the opening formed in the cover. The sub-bracket 610 may have, for example, the shape of a "C". The sub-bracket 610 may include a predetermined space therein, in which at least part of the water-infiltration preventing part 640 is disposed.

The mounting part 630 may be disposed on the support bracket 620 and may be engaged with the sub-bracket 610. The mounting part 630 may be provided in a shape independent of the sub-bracket 610 or the support bracket 620 and may be disposed to face the sub-bracket 610. Alternatively, the mounting part 630 may be disposed at an open side of the sub-bracket 610 having the shape of a "C". Accordingly, the sub-bracket 610 and the mounting part 630 may be arranged to form a strap shape.

The water-infiltration preventing part 640 may be disposed inside the support bracket 620 and the sub-bracket 610. In this process, the water-infiltration preventing part 640 may close an opening area formed at the top of the sub-bracket 610. Additionally, the water-infiltration preventing part 640, together with the one side of the seventh flexible PCB 200, may be disposed in the support bracket 620 and the sub-bracket 610 and may therefore block an inflow of fluid in the direction from the support bracket 620 to the sub-bracket 610 or in the direction from the sub-bracket 610 to the support bracket 620 even though the seventh flexible PCB 200 is disposed outside through the opening area of the sub-bracket 610. The water-infiltration preventing part 640 may include a waterproof tape, or dispensing formed in the support bracket 620 and the sub-bracket 610.

Although it has been exemplified that the first waterproof packing structure 600 has the exterior in the form including the support bracket 620, the sub-bracket 610, and the mounting part 630, the first waterproof packing structure 600 of the disclosure is not limited thereto. For example, the first waterproof packing structure 600 may have a structure in which the support bracket 620, the sub-bracket 610, and the mounting part 630 are integrated, an opening is formed in the middle between the sub-bracket 610 and the mounting part 630, at least part of a flexible PCB is disposed in the opening, and the opening is closed by the water-infiltration preventing part 640.

Additionally or alternatively, an adhesive layer 650 (or an adhesive member) in a strap shape may be disposed on the upper surface of the support bracket 620. The adhesive layer 650 may serve to fix the first waterproof packing structure 600 when the first waterproof packing structure 600 is seated in the sixth connecting hole 115 or the seventh connecting hole 125.

Referring to FIG. 7, a portion of the seventh flexible PCB 200 may be seated in the first waterproof packing structure 600. FIG. 7 illustrates the state in which at least part of the second sub-FPCB 200c of the seventh flexible PCB 200 extends above or below the first waterproof packing structure 600 through the opening area formed in the sub-bracket 610 of the first waterproof packing structure 600. Alternatively, FIG. 7 illustrates the state in which the opening area formed in the sub-bracket 610 of the first waterproof packing structure 600 is closed by the water-infiltration preventing part 640 while at least part of the second sub-FPCB 200c is mounted in the first waterproof packing structure 600. The twelfth connecting PCB 172a may be disposed at one end of the second sub-FPCB 200c, and the second PCB fixing part 201b may be disposed at an opposite end of the second sub-FPCB 200c. The central FPCB 200a may be connected to the second PCB fixing part 201b. While a portion of the second sub-FPCB 200c is disposed in the opening area of the sub-bracket 610, the water-infiltration preventing part 640 of the first waterproof packing structure 600 may close the opening area of the sub-bracket 610 except for the portion in which the second sub-FPCB 200c is disposed, and thus the first waterproof packing structure 600 may block an inflow of fluid from the outside.

Referring to FIG. 8, state 801 illustrates one side of the first housing 110 of the electronic device 100, and state 803 illustrates a section taken along line C-C' in state 801. Referring to state 801 and state 803, the first waterproof packing structure 600 may be seated in the sixth connecting hole 115 of the first housing 110. At least part of the first sub-FPCB 200b may be mounted in the first waterproof packing structure 600, and the first sub-FPCB 200b may extend from the portion mounted in the first waterproof packing structure 600. Accordingly, the first sub-FPCB 200b may be disposed in a predetermined area of the first housing 110. The eleventh connecting PCB 171a may be disposed at an end of the first sub-FPCB 200b. The eleventh connecting PCB 171a may be connected with the separately provided first printed circuit board 171 through the first connector 171b. As illustrated, the sixth connecting hole 115 may have a shape in which an opening is formed at the top and a cavity is formed inside. At least part of the first waterproof packing structure 600 may be disposed in the cavity. An opposite side of the first sub-FPCB 200b, at least part of which is disposed in the first waterproof packing structure 600, may be connected to the central FPCB 200a. The first PCB fixing part 201a may be provided between the first sub-FPCB 200b and the central FPCB 200a. The first PCB fixing part 201a may be fixed to one side of the first hinge cover 110c disposed to surround one side of the hinge structure 130.

Figure 9:
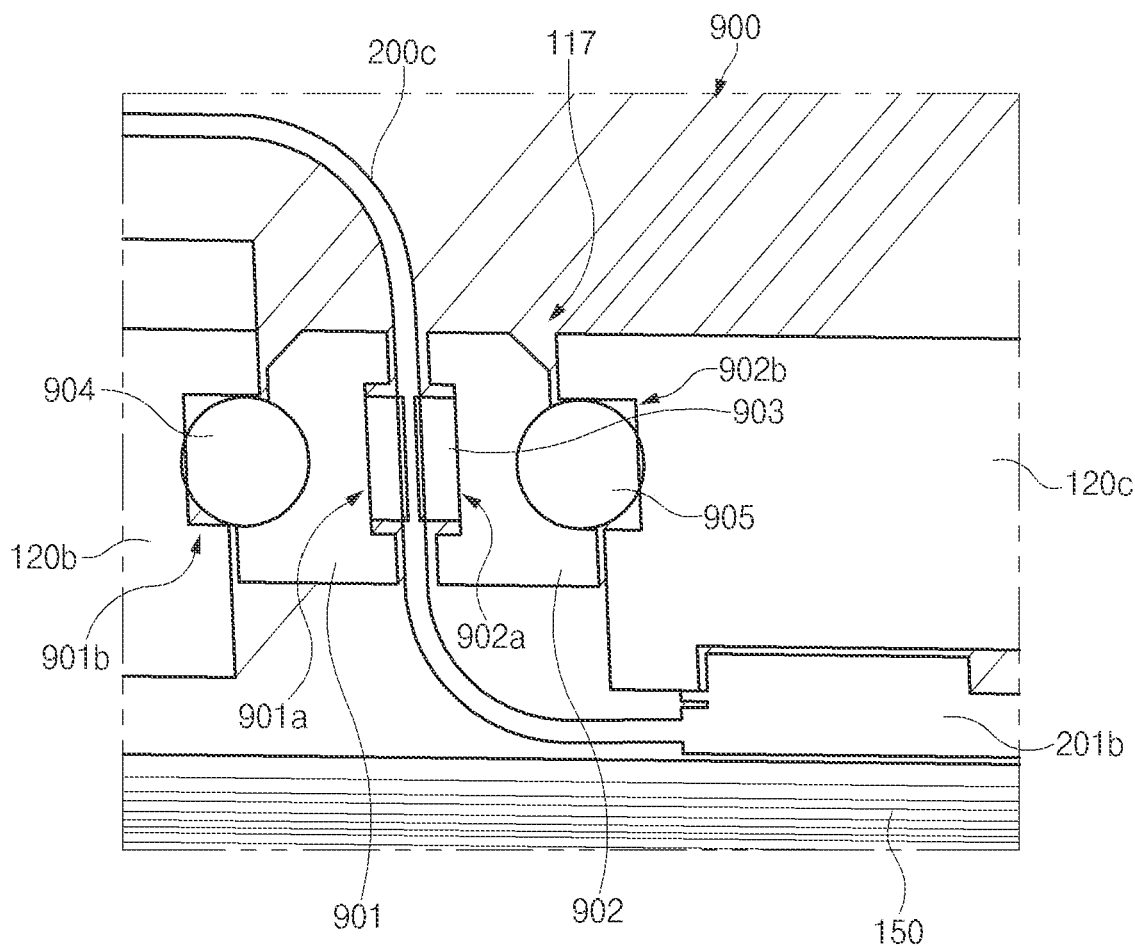
FIG. 9 is a view illustrating another example of a waterproof packing structure of an electronic device according to an embodiment of the disclosure.

FIG. 9 is a view illustrating another example of a waterproof packing structure of an electronic device according to an embodiment of the disclosure.

Referring to FIG. 9, a second waterproof packing structure 900 of the disclosure may be disposed on one side of a connecting hole 117 and may be disposed to close an opening area of the connecting hole 117 while supporting at least part of a flexible PCB.

For example, the connecting hole 117 may be formed in a bottom part (e.g., the second bottom part 120b of FIG. 2) of the housing. The connecting hole 117 may be vertically formed through the bottom part. The connecting hole 117 may be formed such that the lower opening area is larger than the upper opening area in the illustrated drawing. Rail grooves 901a and 902a may be disposed inside the connecting hole 117.

The second waterproof packing structure 900 may include a first packing structure 901 that supports at least part of the second sub-FPCB 200c (or the first sub-FPCB) on one side, a second packing structure 902 that supports the at least part of the second sub-FPCB 200c on an opposite side, a PCB water-infiltration preventing part 903, a first water-infiltration preventing part 904, and a second water-infiltration preventing part 905.

The first packing structure 901 and the second packing structure 902 may be paired and may be disposed to face each other. For example, the first packing structure 901 may include, on the inside thereof, the first rail groove 901a with a predetermined length in which the PCB water-infiltration preventing part 903 is disposed, and may include, on the outside thereof, a first water-infiltration preventing groove 901*b* in which the first water-infiltration preventing part 904 is disposed to prevent a fluid flow between the first packing structure 901 and the connecting hole 117. The second packing structure 902 may have a shape that is symmetric to the shape of the first packing structure 901. For example, the second packing structure 902 may include, on the inside thereof, the second rail groove 902*a* with a predetermined length in which the PCB water-infiltration preventing part 903 is disposed, and may include, on the outside thereof, a second water-infiltration preventing groove 902*b* in which the second water-infiltration preventing part 905 is disposed to prevent a fluid flow between the second packing structure 902 and the connecting hole 117.

The PCB water-infiltration preventing part 903 may have a central portion in which the at least part of the second sub-FPCB 200*c* is mounted. The PCB water-infiltration preventing part 903 may support the second sub-FPCB 200*c* according to the pressing of the first packing structure 901 and the second packing structure 902 while closing an upper side surface and a lower side surface that are brought into contact with the second sub-FPCB 200*c*. Accordingly, even though the second sub-FPCB 200*c* is mounted, the PCB water-infiltration preventing part 903 may close the opening area formed between the first packing structure 901 and the second packing structure 902, thereby preventing fluid from being vertically introduced into the second waterproof packing structure 900.

The first water-infiltration preventing part 904 may be seated between the first water-infiltration preventing groove 901*b* of the first packing structure 901 and a groove formed on the inner wall of the connecting hole 117 and may block an inflow of fluid from the lower surface to the upper surface of the second waterproof packing structure 900. The second water-infiltration preventing part 905 may be seated between the second water-infiltration preventing groove 902*b* of the second packing structure 902 and a groove formed on the inner wall of the connecting hole 117 and may block an inflow of fluid from the lower surface to the upper surface of the second waterproof packing structure 900.

Additionally, one side of the second sub-FPCB 200*c* may be connected to the second PCB fixing part 201*b*. The second PCB fixing part 201*b* may be fixed to one side of the second hinge cover 120*c*. A portion of the display 150 may be disposed on the second housing 120. The structure described above with reference to FIG. 9 may be identically applied to a connecting hole formed in the first housing 110.

According to various embodiments, in the case where one housing (e.g., the first housing 110 or the second housing 120) has a plurality of connecting holes formed therein, the waterproof structures described above with reference to FIGS. 2 to 9 may be applied to the connecting holes in combination. For example, the waterproof structure described with reference to FIG. 2 may be applied to a connecting hole formed in the first housing 110, and the waterproof structure described with reference to FIGS. 5 to 8 may be applied to a connecting hole formed in the second housing 120.

Although it has been exemplified that connecting holes are formed in both the first housing 110 and the second housing 120, the disclosure is not limited thereto. For example, a connecting hole may be formed in only the first housing 110, or a connecting hole may be formed in only the second housing 120. In this case, the arrangement of the printed circuit boards may be varied. For example, the first printed circuit board 171 may be disposed on the upper surface of the first bottom part 110*b* of the first housing 110, and the second printed circuit board 172 may be disposed on the lower surface of the second bottom part 120*b* of the second housing 120. Further, at least one connecting hole may be formed in the hinge structure 130. In this case, the waterproof members or the waterproof packing structures described above with reference to FIGS. 2 to 9 may be disposed in the at least one connecting hole formed in the hinge structure 130.

Figure 10:
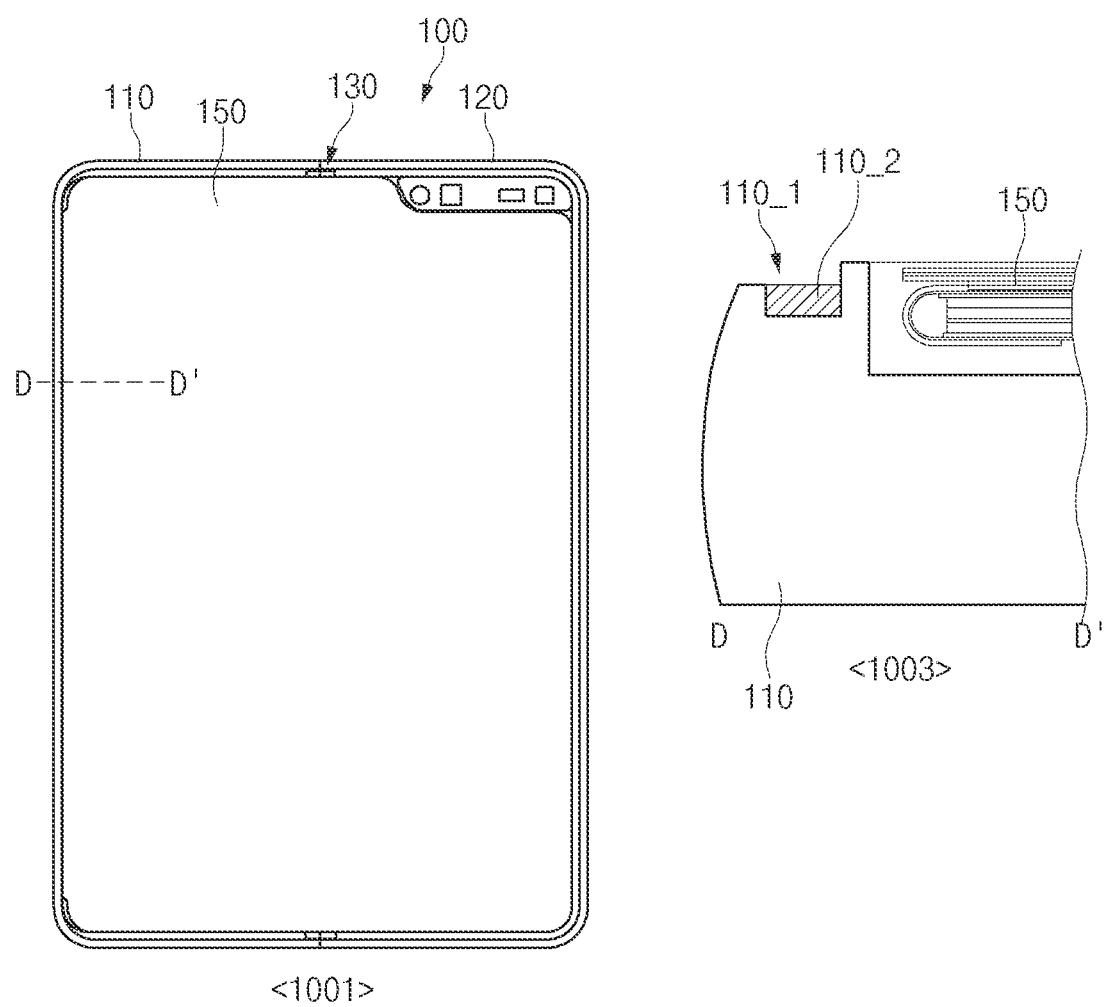
FIG. 10 is a view illustrating an example of an edge structure of an electronic device according to an embodiment of the disclosure.

FIG. 10 is a view illustrating an example of an edge structure of an electronic device according to an embodiment of the disclosure.

Figure 11:
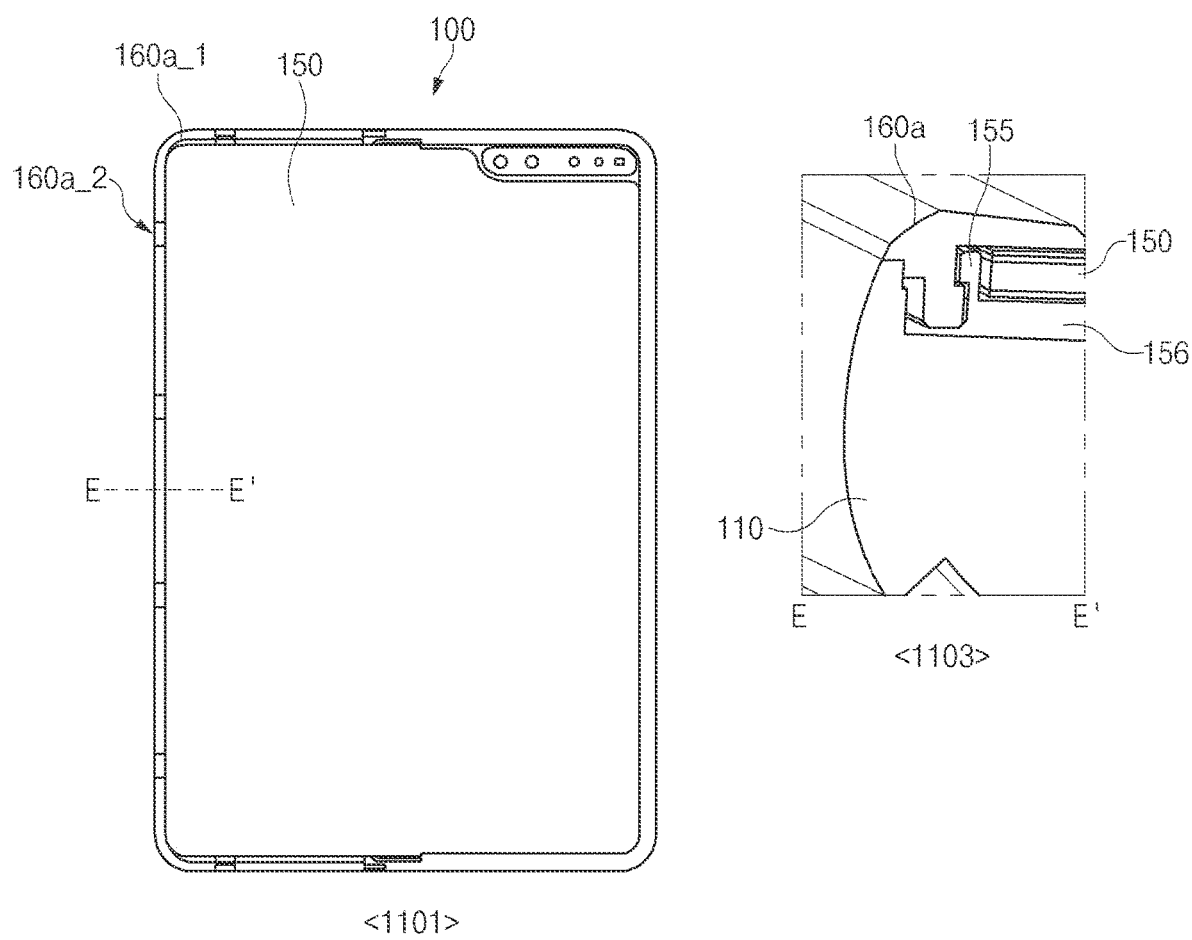
FIG. 11 is a view illustrating an example of a bezel arrangement structure of an electronic device according to an embodiment of the disclosure.

FIG. 11 is a view illustrating an example of a bezel arrangement structure of an electronic device according to an embodiment of the disclosure.

Referring to FIG. 10, state 1001 illustrates a state in which the bezel of the electronic device 100 is removed, and state 1003 illustrates a section taken along line D-D' in state 1001. Referring to state 1001 and state 1003, the electronic device 100 may include the first housing 110 and the second housing 120 and may include the hinge structure 130 disposed between the first housing 110 and the second housing 120. The display 150 may be placed on the first housing 110, the second housing 120, and the hinge structure 130. Here, the first housing 110 may have, at the edge thereof, a bezel groove 110_1 in which the bezel is fixedly seated. The bezel groove 110_1 may be formed along the edge of the first housing 110 and the edge of the second housing 120. A fixing part 110_2 including at least one of bonding or a tape may be disposed in the bezel groove 110_1. The fixing part 110_2 may fix the bezel (e.g., the first bezel 160*a* or the second bezel 160*b* of FIG. 2) that is placed in the bezel groove 110_1.

Referring to FIG. 11, state 1101 illustrates the electronic device 100 having the bezel 160*a* coupled thereto, and state 1003 illustrates an example of a section taken along line E-E' in state 1101 in which the bezel 160*a* is coupled to the electronic device 100. Referring to state 1101 and state 1103, the display 150 may be placed on an upper side of the electronic device 100, and the bezel 160*a* may be disposed at the edge of the electronic device 100. The bezel 160*a* may be fixed, by a snap-fit connection, to the first housing 110 or a support layer 155 (e.g., an SUS layer) that is disposed on the first housing 110 and the display 150. Alternatively, the bezel 160*a* may be fixed by a fixing part provided on the support layer 155.

A waterproof tape 156 may be disposed between the display 150 and the bezel 160*a*. The waterproof tape 156 may be disposed between the edge of the display 150 and the edge of the support layer 155 (or the edges of the first housing 110 and the second housing 120) and may block a fluid flow into the display 150 from the outside. The waterproof tape 156 may provide a waterproof function by forming a closed curve while covering the entire edge of the display 150. Additionally or alternatively, the bezel 160*a* may be formed to be larger than the shape illustrated and may be firmly fixed to the first housing 110 or the second housing 120 through a screw. For example, the screw may be tightened against a side surface of the bezel 160*a* in a direction parallel to the display 150 to fix the bezel 160*a* to the first housing 110 or the second housing 120. Alternatively, the screw may be tightened against the upper surface of the bezel 160*a* in the direction perpendicular to the display 150 to fix the bezel 160*a* to the first housing 110 or the second housing 120 (or the support layer 155).

The bezel 160*a* may be formed of different materials along the periphery of the display 150. For example, the bezel 160*a* may include a first partial bezel 160*a*_1 formed of a nonmetal material and provided in an area where an antenna is disposed to transmit and receive communication signals in a specific frequency band and a second partial bezel 160_2 formed of a metal material in relation to reinforcement and provided in an area where the antenna is not disposed. The first partial bezel 160a_1 and the second partial bezel 160a_2 may be successively connected. In this regard, the first partial bezel 160a_1 may be formed by injection molding based on the second partial bezel 160a_2 formed of a metal material. Alternatively, the bezel 160a may be provided by coupling the first and second partial bezels 160a_1 and 160a_2 of different materials to positions on the periphery of the electronic device 100.

According to the various embodiments, an electronic device according to an embodiment may include a foldable housing (e.g., 110 and 120 of FIG. 4C) that includes a hinge structure (e.g., the hinge structure 130 of FIG. 4C), a first housing structure (e.g., 110 of FIG. 4C) that is connected to the hinge structure and that includes a first surface facing a first direction (e.g., the first direction 1000a of FIG. 4C), a second surface facing a second direction (e.g., the second direction 1000b of FIG. 4C) that is opposite to the first direction, and a first side member (e.g., 110a of FIG. 4C) that at least partially surrounds a space formed between the first surface and the second surface, and a second housing structure (e.g., 120 of FIG. 4C) that is connected to the hinge structure and that includes a third surface facing a third direction (e.g., the third direction 1000c of FIG. 4C), a fourth surface facing a fourth direction (e.g., the fourth direction 1000b of FIG. 4C) that is opposite to the third direction, and a second side member (e.g., 120a of FIG. 4C) that at least partially surrounds a space formed between the third surface and the fourth surface, the second housing structure being folded together with the first housing structure 110 around the hinge structure, wherein in a folded state, at least part of the first surface is opposite the third surface, and in an unfolded state, the third direction is the same as the first direction, a display 150 extending from the first surface to the third surface to form at least part of the first surface and the third surface, a first mid-plate (e.g., the first bottom part 110b of FIG. 4C) disposed between the display and the second surface, the first mid-plate extending from the first side member in a direction perpendicular to the first direction and including a first opening (e.g., 75a of FIG. 4C), a second mid-plate (e.g., the second bottom part 120b of FIG. 4C) disposed between the display and the fourth surface, the second mid-plate extending from the second side member in a direction perpendicular to the third direction and including a second opening (e.g., 75b of FIG. 4C), a flexible printed circuit board (FPCB) (e.g., 70 of FIG. 4C) that extends across the hinge structure from a first space formed between the first mid-plate and the second surface to a second space formed between the second mid-plate and the fourth surface, a first sealing member (e.g., 75 of FIG. 4C) that seals the first opening, and a second sealing member (e.g., 76 of FIG. 4C) that seals the second opening.

According to various embodiments, the electronic device may further include a first printed circuit board (e.g., 73 of FIG. 4C) that is located between the first mid-plate and the second surface, and a second printed circuit board (e.g., 74 of FIG. 4C) that is located between the second mid-plate and the fourth surface.

According to various embodiments, the flexible printed circuit board may include a first connector (e.g., 74b_1, 73b_1, and 74c_1 of FIG. 4A) that is located in the first opening (e.g., 110b_5 of FIG. 4A), a first portion (e.g., 73_1, 74_1, and 53a_1 of FIG. 4A) that extends between the first printed circuit board (e.g., 171 of FIG. 4A) and the first connector, a second connector (e.g., 74b_2, 73b_2, and 74c_2 of FIG. 4A) that is located in the second opening (e.g., 120b_5 of FIG. 4A), a second portion (e.g., 73a_2, 74a_2, and 53a_1 of FIG. 4A) that extends between the second printed circuit board (e.g., 172 of FIG. 4A) and the second connector, and a third portion 403 that extends between the first connector and the second connector.

According to various embodiments, the first sealing member may make contact with the first connector, and the second sealing member may make contact with the second connector.

According to the various embodiments, an electronic device according to an embodiment may include a first housing 110 that includes a first connecting hole (e.g., 110b_2 of FIG. 2 or 75a of FIG. 4C) through one surface of the first housing, a second housing 110, a hinge structure 130 that connects the first housing and the second housing and supports a hinge motion of the first housing or the second housing, a first printed circuit board 171 that is disposed in the first housing, a second printed circuit board 172 that is disposed in the second housing, a first connecting PCB (e.g., at least one of 71a of FIG. 2 or 74b_1 and 74c_1 of FIG. 4A) that is disposed to cover at least part of an opening on one side of the first connecting hole and that is electrically connected to the first printed circuit board, and a flexible PCB 70, at least part of which is disposed in the hinge structure, wherein one side of the flexible PCB is electrically connected with the first connecting PCB.

According to various embodiments, the first printed circuit board may be disposed to cover at least part of an opening on an opposite side of the first connecting hole.

According to various embodiments, the electronic device may further include a first connecting part (e.g., at least one of 71b of FIG. 2 or 73b_1 and 73b_2 of FIG. 4A) that connects the first connecting PCB and the first printed circuit board, at least part of the first connecting part being seated in the first connecting hole.

According to various embodiments, the first connecting hole may include at least one of a protruding structure extending from an inner wall of the first housing by a predetermined height, a first waterproof member disposed between the first connecting PCB and the protruding structure, or a second waterproof member disposed between the first printed circuit board and the protruding structure.

According to various embodiments, the electronic device may further include a front bracket disposed on an upper surface of the first connecting PCB, and a coupling member fastened to the first printed circuit board, with at least part of the coupling member disposed in the first connecting hole through the front bracket.

According to various embodiments, the electronic device may further include a front bracket disposed on an upper surface of the first connecting PCB, a rear bracket disposed on a rear surface of the first printed circuit board, and a coupling member fastened to the rear bracket through one side of the first printed circuit board, with at least part of the coupling member disposed in the first connecting hole through the front bracket.

According to various embodiments, the second housing may include at least one of a second connecting hole (e.g., 120b_2 of FIG. 2 or 75b of FIG. 4C) through one surface of the second housing, or a second connecting PCB disposed to cover at least part of an opening on one side of the second connecting hole, the second connecting PCB having one side electrically connected to the second printed circuit board and an opposite side connected to the flexible PCB.

According to various embodiments, the second printed circuit board may include a waterproof structure disposed to cover at least part of an opening on an opposite side of the second connecting hole, and the electronic device may further include a second connecting part that connects the second connecting PCB and the second printed circuit board, at least part of the second connecting part being seated in the second connecting hole.

According to the various embodiments, an electronic device according to an embodiment may include a first housing including a first connecting hole (e.g., a first connecting hole vertically formed) through one surface of the first housing, a second housing including a second connecting hole through one surface of the second housing, a hinge structure that connects the first housing and the second housing and supports a hinge motion of the first housing or the second housing, a first printed circuit board disposed in the first housing, a second printed circuit board disposed in the second housing, a flexible PCB that connects the first printed circuit board and the second printed circuit board, at least part of the flexible PCB being disposed on one side of the hinge structure, a first waterproof member that blocks a fluid flow (e.g., a vertical fluid flow) into the first connecting hole, and a second waterproof member that blocks a fluid flow into the second connecting hole. The flexible PCB may include a first sub-FPCB, at least part of which is mounted in the first connecting hole, a second sub-FPCB, at least part of which is mounted in the second connecting hole, and a central FPCB that connects the first sub-FPCB and the second sub-FPCB.

According to various embodiments, the electronic device may further include a waterproof packing structure, at least part of which is disposed in the first connecting hole, the waterproof packing structure including, on one side thereof, an opening area in which at least part of the first sub-FPCB is placed, wherein the first waterproof member is disposed in the waterproof packing structure.

According to various embodiments, the waterproof packing structure may include a support bracket seated in the first connecting hole, an adhesive layer bonded to the inside of the first connecting hole, a sub-bracket formed on the support bracket and including an opening area on one side of the sub-bracket, a mounting part disposed to block one side of the sub-bracket, and the first waterproof member disposed in the support bracket and the sub-bracket to prevent an inflow of fluid, wherein a portion of the first sub-FPCB is disposed in the middle of the first waterproof member.

According to various embodiments, the electronic device may further include a waterproof packing structure, at least part of which is disposed in the second connecting hole, the waterproof packing structure including, on one side thereof, an opening area in which at least part of the second sub-FPCB is placed, wherein the second waterproof member is disposed in the waterproof packing structure. The waterproof packing structure may include a support bracket seated in the second connecting hole, an adhesive layer bonded to the inside of the second connecting hole, a sub-bracket formed on the support bracket and including an opening area on one side of the sub-bracket, a mounting part disposed to block one side of the sub-bracket, and the second waterproof member disposed in the support bracket and the sub-bracket to prevent an inflow of fluid, wherein a portion of the second sub-FPCB is disposed in the middle of the second waterproof member.

According to various embodiments, the electronic device may further include a first packing structure that surrounds at least part of one side of the first waterproof member, and a second packing structure that surrounds at least part of an opposite side of the first waterproof member and that is disposed to be symmetric to the first packing structure.

According to various embodiments, the electronic device may further include a first water-infiltration preventing part disposed between the first packing structure and the first connecting hole, and a second water-infiltration preventing part disposed between the second packing structure and the first connecting hole.

According to various embodiments, the electronic device may further include at least one PCB fixing part that fixes the flexible PCB to one side of the first housing or the second housing.

Figure 12:
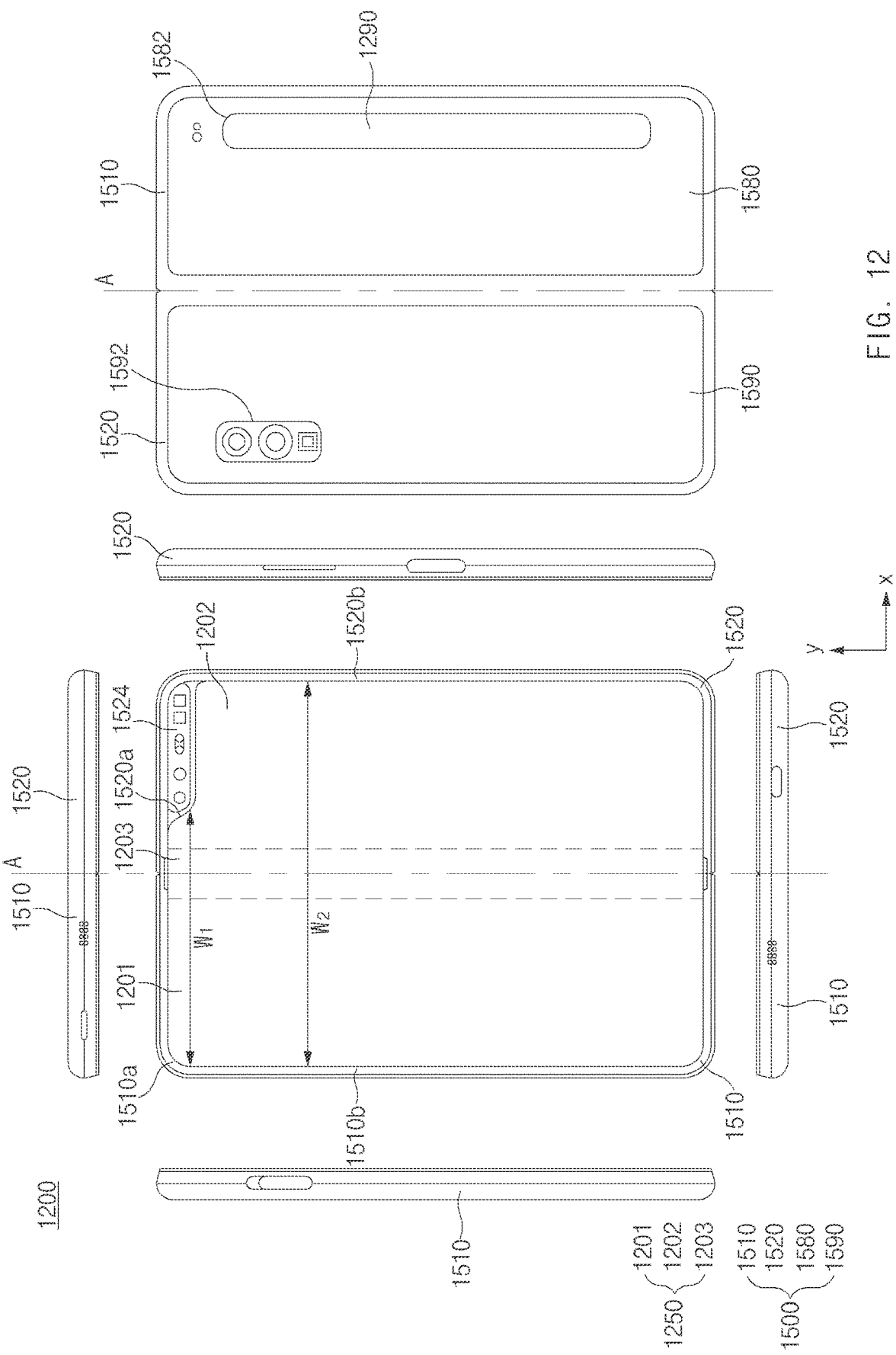
FIG. 12 is a view illustrating a flat state of a foldable electronic device including a waterproof structure according to an embodiment of the disclosure.

FIG. 12 is a view illustrating a flat state of a foldable electronic device including a waterproof structure according to an embodiment of the disclosure.

Figure 13:
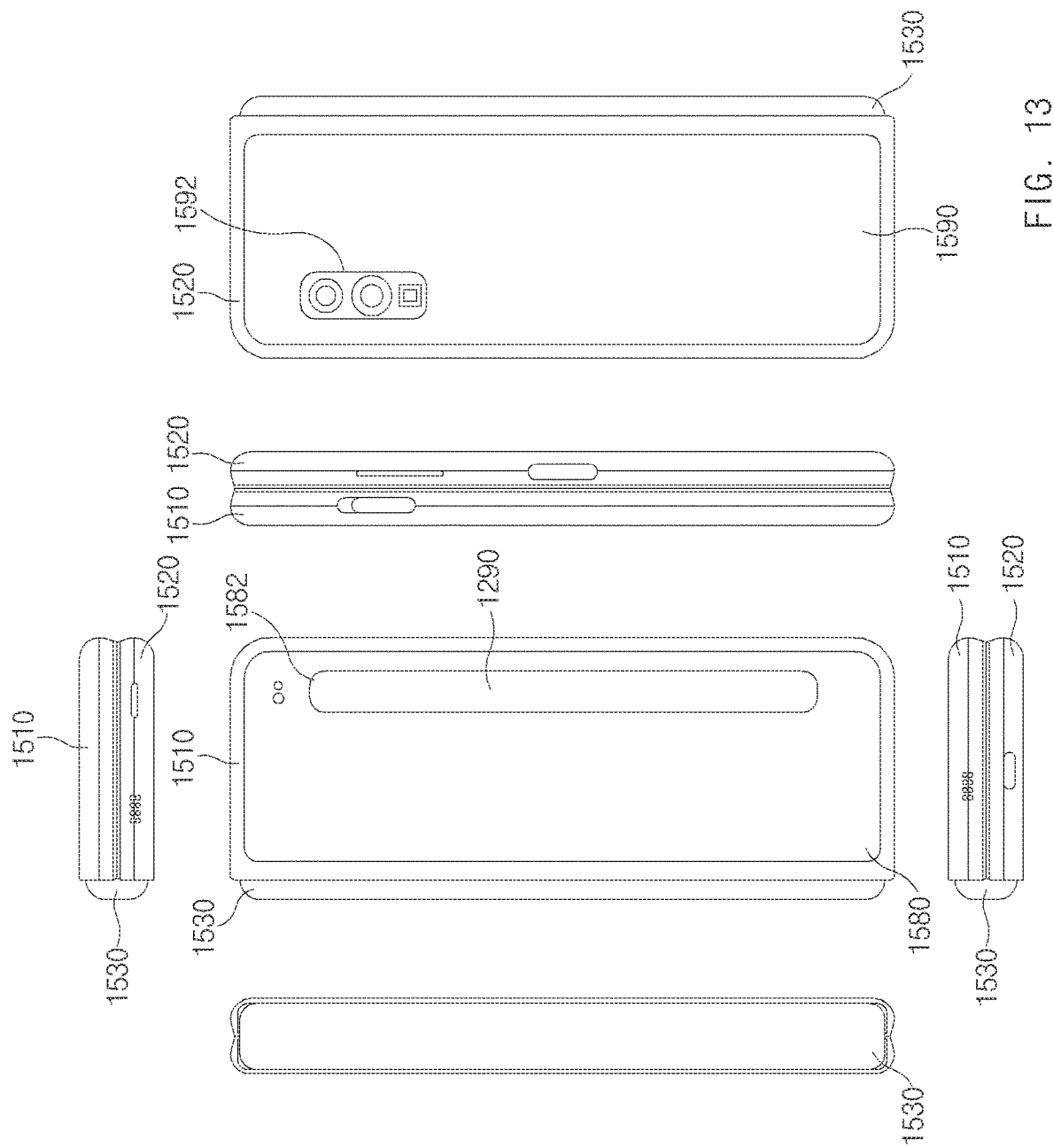
FIG. 13 is a view illustrating a folded state of a foldable electronic device including a waterproof structure according to an embodiment of the disclosure.

FIG. 13 is a view illustrating a folded state of a foldable electronic device including a waterproof structure according to an embodiment of the disclosure.

Referring to FIGS. 12 and 13, in an embodiment, an electronic device 1200 may include a foldable housing 1500, a hinge cover 1530 that covers a foldable portion of the foldable housing 1500, and a flexible or foldable display 1250 (hereinafter, abbreviated to the "display 1250") that is disposed in a space formed by the foldable housing 1500. In this disclosure, a surface on which the display 1250 is disposed is defined as a first surface or a front surface of the electronic device 1200. A surface opposite to the front surface is defined as a second surface or a rear surface of the electronic device 1200. Furthermore, a surface that surrounds the space formed between the front surface and the rear surface is defined as a third surface or a side surface of the electronic device 1200.

In an embodiment, the foldable housing 1500 may include a first housing structure 1510, a second housing structure 1520 including a sensor area 1524, a first back cover 1580, and a second back cover 1590. The foldable housing 1500 of the electronic device 1200 is not limited to the form and the coupling illustrated in FIGS. 12 and 2 and may be implemented by a combination and/or a coupling of other shapes or parts. For example, in another embodiment, the first housing structure 1510 and the first back cover 1580 may be integrally formed with each other, and the second housing structure 1520 and the second back cover 1590 may be integrally formed with each other.

In the illustrated embodiment, the first housing structure 1510 and the second housing structure 1520 may be disposed on opposite sides of a folding axis (axis A) and may have shapes that are entirely symmetric to each other with respect to the folding axis A. As will be described below, the angle or distance between the first housing structure 1510 and the second housing structure 1520 may vary depending on whether the electronic device 1200 is in a flat state, a folded state, or an intermediate state. In the illustrated embodiment, unlike the first housing structure 1510, the second housing structure 1520 may additionally include the sensor area 1524 in which various sensors are arranged, but may have a mutually symmetrical shape in the other area.

In an embodiment, as illustrated in FIG. 12, the first housing structure 1510 and the second housing structure 1520 may form a recess in which the display 1250 is received. In the illustrated embodiment, due to the sensor area 1524, the recess may have two or more different widths in a direction perpendicular to the folding axis A.

For example, the recess may have (1) a first width w1 between a first portion 1510a of the first housing structure

1510 that is parallel to the folding axis A and a first portion 1520a of the second housing structure 1520 that is formed on the periphery of the sensor area 1524 and (2) a second width w2 formed by a second portion 1510b of the first housing structure 1510 and a second portion 1520b of the second housing structure 1520 that does not correspond to the sensor area 1524 and that is parallel to the folding axis A. In this case, the second width w2 may be greater than the first width w1. In other words, the first portion 1510a of the first housing structure 1510 and the first portion 1520a of the second housing structure 1520 that have asymmetrical shapes may form the first width w1 of the recess, and the second portion 1510b of the first housing structure 1510 and the second portion 1520b of the second housing structure 1520 that have symmetrical shapes may form the second width w2 of the recess. In an embodiment, the first portion 1520a and the second portion 1520b of the second housing structure 1520 may have different distances from the folding axis A. The width of the recess is not limited to the illustrated example. In various embodiments, the recess may have a plurality of widths by the form of the sensor area 1524 or by the portions of the first housing structure 1510 and the second housing structure 1520 that have asymmetrical shapes.

In an embodiment, at least part of the first housing structure 1510 and the second housing structure 1520 may be formed of a metal material or a non-metal material that has a strength selected to support the display 1250.

In an embodiment, the sensor area 1524 may be formed adjacent to one corner of the second housing structure 1520 and may have a predetermined area. However, the arrangement, shape, and size of the sensor area 1524 are not limited to the illustrated example. For example, in another embodiment, the sensor area 1524 may be provided in another corner of the second housing structure 1520 or in any area between an upper corner and a lower corner of the second housing structure 1520. In an embodiment, parts for performing various functions that are embedded in the electronic device 1200 may be exposed on the front surface of the electronic device 1200 though the sensor area 1524 or through one or more openings formed in the sensor area 1524. In various embodiments, the parts may include various types of sensors. The sensors may include, for example, at least one of a front camera, a receiver, or a proximity sensor.

The first back cover 1580 may be disposed on the rear surface of the electronic device 1200 and may be located on one side of the folding axis A. The first back cover 1580 may have, for example, a substantially rectangular periphery, and the periphery may be surrounded by the first housing structure 1510. Similarly, the second back cover 1590 may be disposed on the rear surface of the electronic device 1200 and may be located on an opposite side of the folding axis A. The second back cover 1590 may have a periphery surrounded by the second housing structure 1520.

In the illustrated embodiment, the first back cover 1580 and the second back cover 1590 may have substantially symmetrical shapes with respect to the folding axis (the axis A). However, the first back cover 1580 and the second back cover 1590 do not necessarily have to have mutually symmetrical shapes. In another embodiment, the electronic device 1200 may include the first back cover 1580 and the second back cover 1590 that have various shapes. In another embodiment, the first back cover 1580 may be integrally formed with the first housing structure 1510, and the second back cover 1590 may be integrally formed with the second housing structure 1520.

In an embodiment, the first back cover 1580, the second back cover 1590, the first housing structure 1510, and the second housing structure 1520 may form a space in which various parts (e.g., a printed circuit board or a battery) of the electronic device 1200 are disposed. In an embodiment, one or more parts may be disposed or visually exposed on the rear surface of the electronic device 1200. For example, at least part of a sub-display 1290 may be visually exposed through a first rear area 1582 of the first back cover 1580. In another embodiment, one or more parts or sensors may be visually exposed through a second rear area 1592 of the second back cover 1590. In various embodiments, the sensors may include a proximity sensor and/or a rear camera.

Referring to FIG. 13, the hinge cover 1530 may be disposed between the first housing structure 1510 and the second housing structure 1520 and may be configured to hide an internal part (e.g., a hinge structure). In an embodiment, the hinge cover 1530 may be hidden by a portion of the first housing structure 1510 and a portion of the second housing structure 1520, or may be exposed to the outside, depending on the state (a flat state or a folded state) of the electronic device 1200.

For example, when the electronic device 1200 is in a flat state as illustrated in FIG. 12, the hinge cover 1530 may not be exposed by being hidden by the first housing structure 1510 and the second housing structure 1520. In another example, when the electronic device 1200 is in a folded state (e.g., a fully folded state) as illustrated in FIG. 13, the hinge cover 1530 may be exposed between the first housing structure 1510 and the second housing structure 1520 to the outside. In another example, when the electronic device 1200 is in an intermediate state in which the first housing structure 1510 and the second housing structure 1520 are folded with a certain angle, the hinge cover 1530 may be partially exposed between the first housing structure 1510 and the second housing structure 1520 to the outside. However, in this case, the exposed area may be smaller than that when the electronic device 1200 is in the fully folded state. In an embodiment, the hinge cover 1530 may include a curved surface.

The display 1250 may be disposed in the space formed by the foldable housing 1500. For example, the display 1250 may be seated in the recess formed by the foldable housing 1500 and may form almost the entire front surface of the electronic device 1200.

Accordingly, the front surface of the electronic device 1200 may include the display 1250, and a partial area of the first housing structure 1510 and a partial area of the second housing structure 1520 that are adjacent to the display 1250. Further, the rear surface of the electronic device 1200 may include the first back cover 1580, a partial area of the first housing structure 1510 that is adjacent to the first back cover 1580, the second back cover 1590, and a partial area of the second housing structure 1520 that is adjacent to the second back cover 1590.

The display 1250 may refer to a display, at least a partial area of which is able to be transformed into a flat surface or a curved surface. In an embodiment, the display 1250 may include a folding area 1203, a first area 1201 disposed on one side of the folding area 1203 (on the left side of the folding area 1203 illustrated in FIG. 12), and a second area 1202 disposed on an opposite side of the folding area 1203 (on the right side of the folding area 1203 illustrated in FIG. 12).

The areas of the display 1250 illustrated in FIG. 12 are illustrative, and the display 1250 may be divided into a plurality of (e.g., four or more, or two) areas depending on the structure or function of the display 1250. For example, in the embodiment illustrated in FIG. 12, the areas of the display 1250 may be divided from each other by the folding area 1203 extending parallel to the y axis or by the folding axis (the axis A). However, in another embodiment, the display 1250 may be divided into areas with respect to another folding area (e.g., a folding area parallel to the x axis) or another folding axis (e.g., a folding axis parallel to the x axis).

The first area 1201 and the second area 1202 may entirely have symmetrical shapes with respect to the folding area 1203. Unlike the first area 1201, the second area 1202 may include a notch that is cut according to the presence of the sensor area 1524. However, in the other area, the second area 1201 may have a shape symmetric to that of the first area 101. In other words, the first area 1201 and the second area 1202 may each include a portion having a symmetrical shape and a portion having an asymmetrical shape.

Hereinafter, operations of the first housing structure 1510 and the second housing structure 1520 and the areas of the display 1250 according to states (e.g., a flat state and a folded state) of the electronic device 1200 will be described.

In an embodiment, when the electronic device 1200 is in a flat state (e.g., FIG. 12), the first housing structure 1510 and the second housing structure 1520 may be arranged to face the same direction while forming an angle of 180 degrees. The surface of the first area 1201 of the display 1250 and the surface of the second area 1202 thereof may face the same direction (e.g., the forward direction of the electronic device) while forming an angle of 180 degrees. The folding area 1203 may form the same plane together with the first area 1201 and the second area 1202.

In an embodiment, when the electronic device 1200 is in a folded state (e.g., FIG. 13), the first housing structure 1510 and the second housing structure 1520 may face each other. The surface of the first area 1201 of the display 1250 and the surface of the second area 1202 thereof may face each other while forming a narrow angle (e.g., an angle between 0 degrees and 10 degrees). At least part of the folding area 1203 may form a curved surface having a predetermined curvature.

In an embodiment, when the electronic device 1200 is in an intermediate state (e.g., FIG. 13), the first housing structure 1510 and the second housing structure 1520 may be arranged with a certain angle therebetween. The surface of the first area 1201 of the display 1250 and the surface of the second area 1202 thereof may form an angle that is greater than that in the folded state and is smaller than that in the flat state. At least part of the folding area 1203 may form a curved surface having a predetermined curvature, and the curvature may be smaller than that in the folded state.

Figure 14:
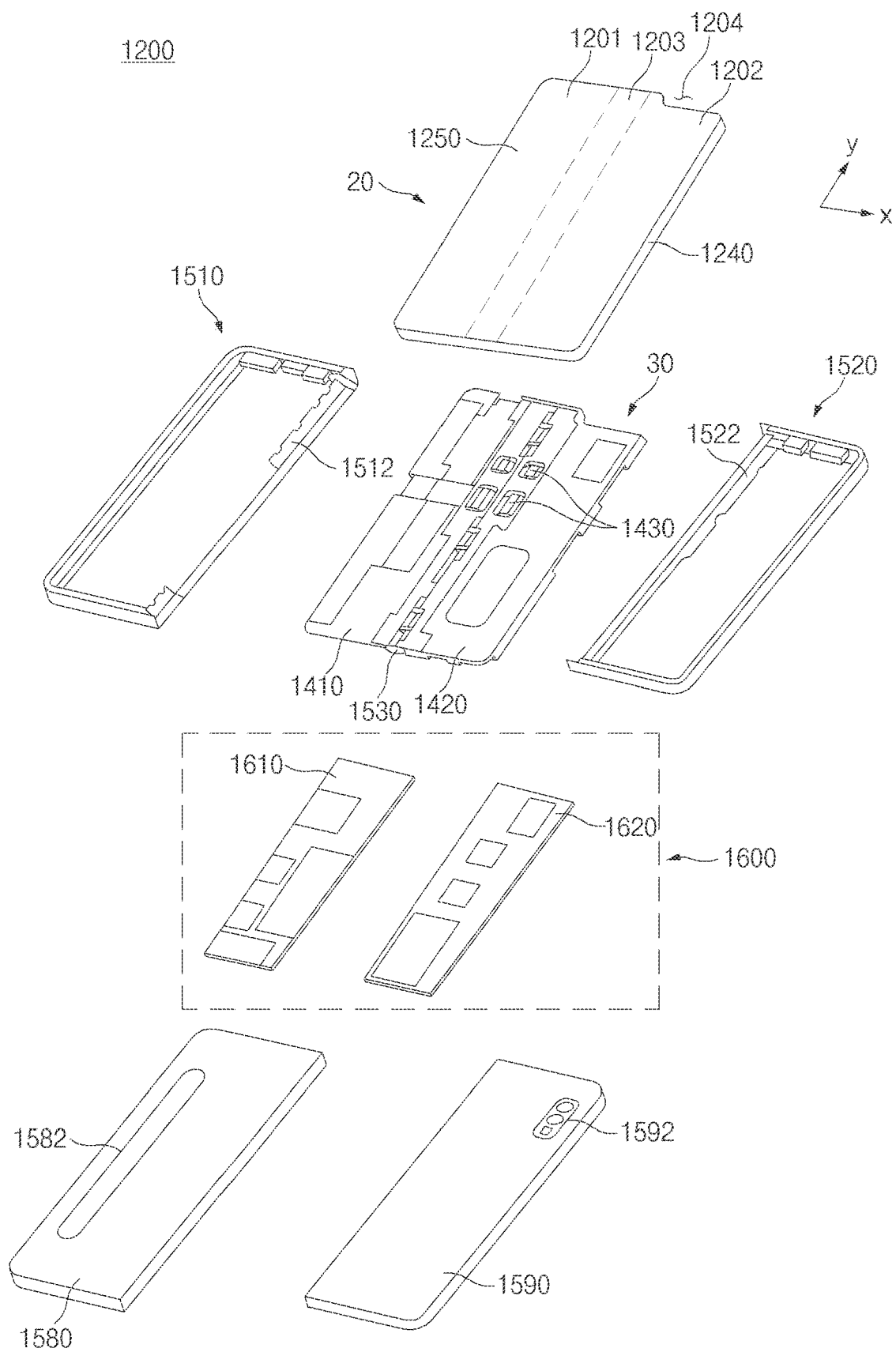
FIG. 14 is an exploded perspective view illustrating a foldable electronic device including a waterproof structure according to an embodiment of the disclosure.

FIG. 14 is an exploded perspective view illustrating a foldable electronic device including a waterproof structure according to an embodiment of the disclosure.

Referring to FIG. 14, in an embodiment, the electronic device 1200 may include a display unit 20, a bracket assembly 30, a PCB 1600, the first housing structure 1510, the second housing structure 1520, the first back cover 1580, and the second back cover 1590. In this disclosure, the display unit 20 may be referred to as a display module or a display assembly.

The display unit 20 may include the display 1250 and at least one plate or layer 1240 on which the display 1250 is seated. In an embodiment, the plate 1240 may be disposed between the display 1250 and the bracket assembly 30. The display 1250 may be disposed on at least part of one surface (e.g., the upper surface with respect to FIG. 14) of the plate 1240. The plate 1240 may be formed in a shape corresponding to the display 1250. For example, a partial area of the plate 1240 may be formed in a shape corresponding to a notch 1204 of the display 1250.

The bracket assembly 30 may include a first bracket 1410, a second bracket 1420, a hinge structure disposed between the first bracket 1410 and the second bracket 1420, the hinge cover 1530 that covers the hinge structure when viewed from the outside, and a wiring member 1430 (e.g., a flexible printed circuit board (FPCB)) across the first bracket 1410 and the second bracket 1420.

In an embodiment, the bracket assembly 30 may be disposed between the plate 1240 and the PCB 1600. For example, the first bracket 1410 may be disposed between the first area 1201 of the display 1250 and a first PCB 1610. The second bracket 1420 may be disposed between the second area 1202 of the display 1250 and a second PCB 1620.

In an embodiment, the wiring member 1430 and at least part of the hinge structure may be disposed inside the bracket assembly 30. The wiring member 1430 may be arranged in a direction (e.g., the x-axis direction) across the first bracket 1410 and the second bracket 1420. The wiring member 1430 may be arranged in a direction (e.g., the x-axis direction) that is perpendicular to a folding axis (e.g., the y-axis or the folding axis A of FIG. 12) of the folding area 1203 of the electronic device 1200.

As mentioned above, the PCB 1600 may include the first PCB 1610 disposed toward the first bracket 1410 and the second PCB 1620 disposed toward the second bracket 1420. The first PCB 1610 and the second PCB 1620 may be disposed in the space formed by the bracket assembly 30, the first housing structure 1510, the second housing structure 1520, the first back cover 1580, and the second back cover 1590. Parts for implementing various functions of the electronic device 1200 may be mounted on the first PCB 1610 and the second PCB 1620.

The first housing structure 1510 and the second housing structure 1520 may be assembled together to be coupled to opposite sides of the bracket assembly 30 having the display unit 20 coupled thereto. As will be described below, the first housing structure 1510 and the second housing structure 1520 may be coupled with the bracket assembly 30 by sliding along the opposite sides of the bracket assembly 30.

In an embodiment, the first housing structure 1510 may include a first rotation support surface 1512, and the second housing structure 1520 may include a second rotation support surface 1522 corresponding to the first rotation support surface 1512. The first rotation support surface 1512 and the second rotation support surface 1522 may include curved surfaces that correspond to curved surfaces included in the hinge cover 1530.

In an embodiment, when the electronic device 1200 is in a flat state (e.g., the electronic device 1200 of FIG. 12), the first rotation support surface 1512 and the second rotation support surface 1522 may cover the hinge cover 1530, and thus the hinge cover 1530 may not be exposed, or may be minimally exposed, on the rear surface of the electronic device 1200. Meanwhile, when the electronic device 1200 is in a folded state (e.g., the electronic device 1200 of FIG. 13), the first rotation support surface 1512 and the second rotation support surface 1522 may rotate along the curved surfaces included in the hinge cover 1530, and thus the hinge cover 1530 may be maximally exposed on the rear surface of the electronic device 1200.

According to the embodiments of the disclosure, parts of an electronic device may be protected by applying a safer waterproof structure to a hinge area of the electronic device that employs a hinge structure.

Furthermore, the disclosure may provide a waterproof structure for a hinge structure of a foldable electronic device that is fold near the center.

In addition, the disclosure may provide various effects that are directly or indirectly recognized.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A portable communication device comprising:
   a housing including a first housing and a second housing, the first housing including a first inner conductive plate having an opening formed therein, and the second housing including a second inner conductive plate;
   a hinge connected between the first housing and the second housing such that each of the first and second housings is rotatable with respect to the hinge to allow the portable communication device to transition between a folded state and an unfolded state;
   a flexible display disposed over the first inner conductive plate and the second inner conductive plate;
   a first printed circuit board (PCB) disposed in the first housing;
   a second PCB disposed in the second housing;
   a flexible PCB (FPCB) partially overlapped with the hinge such that a first ending portion and a second ending portion of the flexible PCB are connected to the first PCB and the second PCB, respectively, and such that a portion of the flexible PCB between the first and second ending portions passes through the opening; and
   an elastic member in contact with the flexible PCB and covering at least one portion of the opening.

2. The portable communication device of claim 1, further comprises:
   a support member more rigid than the elastic member and in contact with the elastic member.

3. The portable communication device of claim 2, wherein the elastic member and the support member together form a cover member configured to at least partially seal the opening from an external material from entering into the opening.

4. The portable communication device of claim 2, wherein the elastic member is in contact with at least one portion of the support member via an adhesive member.

5. The portable communication device of claim 4, wherein the first inner conductive plate includes a recessed area in which the opening is formed.

6. The portable communication device of claim 5, wherein the support member is disposed at least partially in the recessed area.

7. The portable communication device of claim 2, wherein the support member includes a protruding portion disposed at least partially in the opening.

8. The portable communication device of claim 1, further comprises:
   a first connecting PCB located between the first ending portion of flexible PCB and the first PCB.

9. The portable communication device of claim 8, wherein the flexible PCB comprises:
   a first sub-FPCB, at least part of which is located in the opening, connected to the first connecting PCB.

10. The portable communication device of claim 9, wherein at least part of the elastic member makes contact with the first sub-FPCB.

11. The portable communication device of claim 8, wherein further comprises:
    a first connector connected between the first PCB and the first connecting PCB.

12. The portable communication device of claim 1,
    wherein the second inner conductive plate includes a second opening formed therein, and
    wherein the second ending portion of the flexible PCB passes through the second opening.

13. The portable communication device of claim 12, further comprising:
    a second elastic member in contact with the flexible PCB and covering at least one portion of the second opening.

14. The portable communication device of claim 13, further comprising:
    a second support member more rigid than the second elastic member and in contact with the second elastic member.

15. The portable communication device of claim 14, wherein the second elastic member and the second support member together form a second cover member configured to at least partially seal the second opening from an external material from entering into the second opening.

16. The portable communication device of claim 14, wherein the second elastic member is in contact with at least one portion of the second support member via an adhesive member.

17. The portable communication device of claim 13, wherein further comprises:
    a second connecting PCB located between the second ending portion of flexible PCB and the second PCB.

18. The portable communication device of claim 17, wherein the flexible PCB comprises:
    a second sub-FPCB, at least part of which is located in the second opening, connected to the second connecting PCB.

19. The portable communication device of claim 18, wherein at least part of the second elastic member makes contact with the second sub-FPCB.

20. The portable communication device of claim 17, wherein further comprises:
    a second connector connected between the second PCB and the second connecting PCB.

* * * * *